(12) United States Patent
Basel et al.

(10) Patent No.: US 10,944,353 B2
(45) Date of Patent: Mar. 9, 2021

(54) PNEUMATIC ACTUATION CIRCUIT SYSTEM AND METHOD

(71) Applicant: SUNFOLDING, INC., San Francisco, CA (US)

(72) Inventors: Louis Hong Basel, Berkeley, CA (US); Joshua Earle Erickson, Oakland, CA (US); Dan Goldwater, Amherst, MA (US); Jeffrey Charles Lamb, San Francisco, CA (US); Leila Madrone, San Francisco, CA (US); Vincent Domenic Romanin, San Francisco, CA (US); Matthew N Schneider, Sierra Madre, CA (US)

(73) Assignee: SUNFOLDING, INC., San Francisco, CA (US)

( * ) Notice: Subject to any disclaimer, the term of this patent is extended or adjusted under 35 U.S.C. 154(b) by 238 days.

(21) Appl. No.: 15/955,506

(22) Filed: Apr. 17, 2018

(65) Prior Publication Data

US 2018/0302026 A1    Oct. 18, 2018

Related U.S. Application Data

(60) Provisional application No. 62/486,335, filed on Apr. 17, 2017, provisional application No. 62/486,377, (Continued)

(51) Int. Cl.
*H02S 20/32* (2014.01)
*B25J 9/14* (2006.01)
(Continued)

(52) U.S. Cl.
CPC .............. *H02S 20/32* (2014.12); *B25J 9/142* (2013.01); *F15B 15/10* (2013.01); *F24S 30/425* (2018.05);
(Continued)

(58) Field of Classification Search
CPC ...... F15B 2211/7107; F15B 2211/8855; F15B 2211/6309; F15B 2211/7656; F15B 11/20;
(Continued)

(56) References Cited

U.S. PATENT DOCUMENTS 979,460 A    12/1910  Fulton
2,920,656 A    1/1960  Bertolet
(Continued)

FOREIGN PATENT DOCUMENTS

CA    2330612 A1    6/2002
CN    101783619 A    7/2010
(Continued)

OTHER PUBLICATIONS

Author Unkown, http://www.utilityscalesolar.com/Utility_Scale_Solar,_Inc./USS_Homepage.html, Utility Scale Solar, Inc., 2011.
(Continued)

*Primary Examiner* — Allison Bourke
*Assistant Examiner* — Dujuan A Horton
(74) *Attorney, Agent, or Firm* — Davis Wright Tremaine LLP

(57) ABSTRACT

A system for controlling a rotation of one or more solar panels about an axis of rotation, comprising one or more solar panels defining a longitudinal axis, one or more bellows actuators coupled to the one or more solar panels and defining an axis of rotation parallel to the longitudinal axis of the panels, a fluid source, a first valve circuit coupled to the bellows actuators and the fluid source, a second valve circuit coupled to the bellows actuators and the fluid source, and a controller, wherein introduction or release of fluid from one or more of the bellows actuators is configured to cause rotation of the one or more actuators about the axis of rotation.

19 Claims, 24 Drawing Sheets

Related U.S. Application Data filed on Apr. 17, 2017, provisional application No. 62/486,369, filed on Apr. 17, 2017.

(51) Int. Cl.

| | |
|---|---|
| *F24S 50/20* | (2018.01) |
| *H01L 31/042* | (2014.01) |
| *F24S 30/425* | (2018.01) |
| *H02S 20/10* | (2014.01) |
| *F15B 15/10* | (2006.01) |
| *F24S 30/00* | (2018.01) |
| *G01S 3/786* | (2006.01) |

(52) U.S. Cl.
CPC ............ *F24S 50/20* (2018.05); *H01L 31/042* (2013.01); *H02S 20/10* (2014.12); *F15B 2211/6303* (2013.01); *F15B 2211/6309* (2013.01); *F15B 2211/7107* (2013.01); *F15B 2211/7656* (2013.01); *F15B 2211/8855* (2013.01); *F24S 2030/115* (2018.05); *F24S 2030/12* (2018.05); *G01S 3/7861* (2013.01); *Y02E 10/47* (2013.01); *Y02E 10/50* (2013.01)

(58) Field of Classification Search
CPC .......... F15B 13/06; F15B 13/07; F15B 13/08; F15B 221/71–7128; F15B 221/4053; F15B 221/40576; F15B 221/40553–40569; F15B 15/10; Y02E 10/47; Y02E 10/50; G01S 3/7861; F24S 2030/12; H02S 20/10; H02S 20/32; B25J 9/142; H01L 31/042; Y10T 137/8376; Y10T 137/8593; Y10T 137/87917; Y10T 137/877
USPC ............. 136/246; 137/560, 561 R, 861, 613; 91/525, 530
See application file for complete search history.

(56) References Cited

U.S. PATENT DOCUMENTS

| | | |
|---|---|---|
| 3,284,964 A | 11/1966 | Norio |
| 3,472,062 A | 10/1969 | Owen |
| 3,602,047 A | 8/1971 | Kistler |
| 3,800,398 A | 4/1974 | Harrington, Jr. |
| 3,956,543 A | 5/1976 | Stangeland |
| 3,982,526 A | 9/1976 | Barak |
| 4,063,543 A | 12/1977 | Hedger |
| 4,102,326 A | 7/1978 | Sommer |
| 4,120,635 A | 10/1978 | Langecker |
| 4,154,221 A | 5/1979 | Nelson |
| 4,172,443 A | 10/1979 | Sommer |
| 4,175,540 A | 11/1979 | Roantree et al. |
| 4,185,615 A | 1/1980 | Bottum |
| 4,198,954 A | 4/1980 | Meijer |
| 4,345,582 A | 8/1982 | Aharon |
| 4,424,802 A | 1/1984 | Winders |
| 4,459,972 A | 7/1984 | Moore |
| 4,464,980 A | 8/1984 | Yoshida |
| 4,494,417 A | 1/1985 | Larson et al. |
| 4,566,432 A | 1/1986 | Sobczak et al. |
| 4,620,771 A | 11/1986 | Dominguez |
| 4,751,868 A | 6/1988 | Paynter |
| 4,768,871 A | 9/1988 | Mittelhauser et al. |
| 4,777,868 A | 10/1988 | Larsson |
| 4,784,042 A | 11/1988 | Paynter |
| 4,832,001 A | 5/1989 | Baer |
| 4,848,179 A | 7/1989 | Ubhayakar |
| 4,900,218 A | 2/1990 | Sutherland |
| 4,939,982 A | 7/1990 | Immega et al. |
| 4,954,952 A | 9/1990 | Ubhayakar et al. |
| 4,977,790 A | 12/1990 | Nishi et al. |
| 5,021,798 A | 6/1991 | Ubhayakar |
| 5,040,452 A | 8/1991 | Van Kerkvoort |
| 5,080,000 A | 1/1992 | Bubic et al. |
| 5,156,081 A | 10/1992 | Suzumori |
| 5,181,452 A | 1/1993 | Immega |
| 5,251,538 A | 10/1993 | Smith |
| 5,317,952 A | 6/1994 | Immega |
| 5,337,732 A | 8/1994 | Grundfest et al. |
| 5,386,741 A | 2/1995 | Rennex |
| 5,469,756 A | 11/1995 | Feiten |
| 5,697,285 A | 12/1997 | Nappi et al. |
| 5,816,769 A | 10/1998 | Bauer et al. |
| 6,054,529 A | 4/2000 | O'Donnell et al. |
| 6,080,927 A | 6/2000 | Johnson |
| 6,178,872 B1 | 1/2001 | Schulz |
| 6,557,804 B1 | 5/2003 | Carroll |
| 6,772,673 B2 | 8/2004 | Seto et al. |
| 6,875,170 B2 | 4/2005 | Francois et al. |
| 7,331,273 B2 | 2/2008 | Kerekes et al. |
| 7,531,741 B1 | 5/2009 | Melton et al. |
| 7,614,615 B2 | 11/2009 | Egolf |
| 8,201,473 B2 | 6/2012 | Knoll |
| 8,305,736 B2 | 11/2012 | Yee et al. |
| 8,657,271 B2 | 2/2014 | Szekely et al. |
| 8,700,215 B2 | 4/2014 | Komatsu et al. |
| 8,863,608 B2 | 10/2014 | Fischer et al. |
| 8,899,359 B1 | 12/2014 | Hafenrichter et al. |
| 9,133,864 B2 | 9/2015 | Menon et al. |
| 9,919,434 B1 | 3/2018 | Rey et al. |
| 10,135,388 B2 | 11/2018 | Madrone et al. |
| 10,384,354 B2 | 8/2019 | Griffith et al. |
| 10,562,180 B2 | 2/2020 | Telleria et al. |
| 2005/0034752 A1 | 2/2005 | Gross et al. |
| 2006/0049195 A1 | 3/2006 | Koussios et al. |
| 2009/0097994 A1 | 4/2009 | Beck et al. |
| 2009/0115292 A1 | 5/2009 | Ueda et al. |
| 2009/0151775 A1 | 6/2009 | Pietrzak |
| 2009/0314119 A1 | 12/2009 | Knoll |
| 2010/0043776 A1 | 2/2010 | Gee |
| 2010/0125401 A1 | 5/2010 | Hamama et al. |
| 2011/0073161 A1 | 3/2011 | Scanlon |
| 2011/0114080 A1 | 5/2011 | Childers et al. |
| 2012/0210818 A1 | 8/2012 | Fischer et al. |
| 2012/0285509 A1 | 11/2012 | Surganov |
| 2013/0247962 A1 | 9/2013 | Sakai et al. |
| 2015/0244309 A1* | 8/2015 | Sakai ............... H02S 20/10 250/203.4 |
| 2017/0282360 A1 | 10/2017 | Telleria et al. |

FOREIGN PATENT DOCUMENTS

| | | |
|---|---|---|
| CN | 103786165 A | 5/2014 |
| CO | 6180473 A2 | 7/2010 |
| CO | 6450667 A2 | 5/2012 |
| EP | 2648226 A1 | 10/2013 |
| FR | 2603228 A1 | 3/1988 |
| JP | 2014116360 A | 6/2014 |
| KR | 101034478 B1 | 5/2011 |
| KR | 20130019502 A | 2/2013 |
| RU | 2516595 C2 | 5/2014 |
| RU | 2611571 C1 | 2/2017 |
| SU | 1346918 A1 | 10/1987 |
| WO | 2001017731 A1 | 3/2001 |
| WO | 2011094084 A2 | 8/2011 |
| WO | 12015378 A1 | 2/2012 |

OTHER PUBLICATIONS

International Search Report and Written Opinion dated Aug. 14, 2017, International Patent Application No. PCT/US2017/024730, filed Mar. 29, 2017.

International Search Report and Written Opinion dated Aug. 2, 2018, International Patent Application No. PCT/US2018/028020, filed Apr. 17, 2018, 7 pages.

International Search Report and Written Opinion dated Aug. 2, 2018, International Patent Application No. PCT/US2018/028024, filed Apr. 17, 2018, 7 pages.

(56) References Cited

OTHER PUBLICATIONS

International Search Report and Written Opinion dated Aug. 29, 2019, Patent Application No. PCT/US2019/034202, filed May 28, 2019, 7 pages.
International Search Report and Written Opinion dated Aug. 9, 2018, International Patent Application No. PCT/US2018/028025, filed Apr. 17, 2018, 7 pages.
International Search Report and Written Opinion dated May 5, 2016, International Patent Application No. PCT/US2016/015857, filed Jan. 30, 2016.
Seba, "Solar Trillions," pp. 246-250, Jan. 28, 2010.
The Wiley Encyclopedia of Packaging Technology 3rd Ed., Wiley Publications, p. 145, Sep. 2009.

* cited by examiner

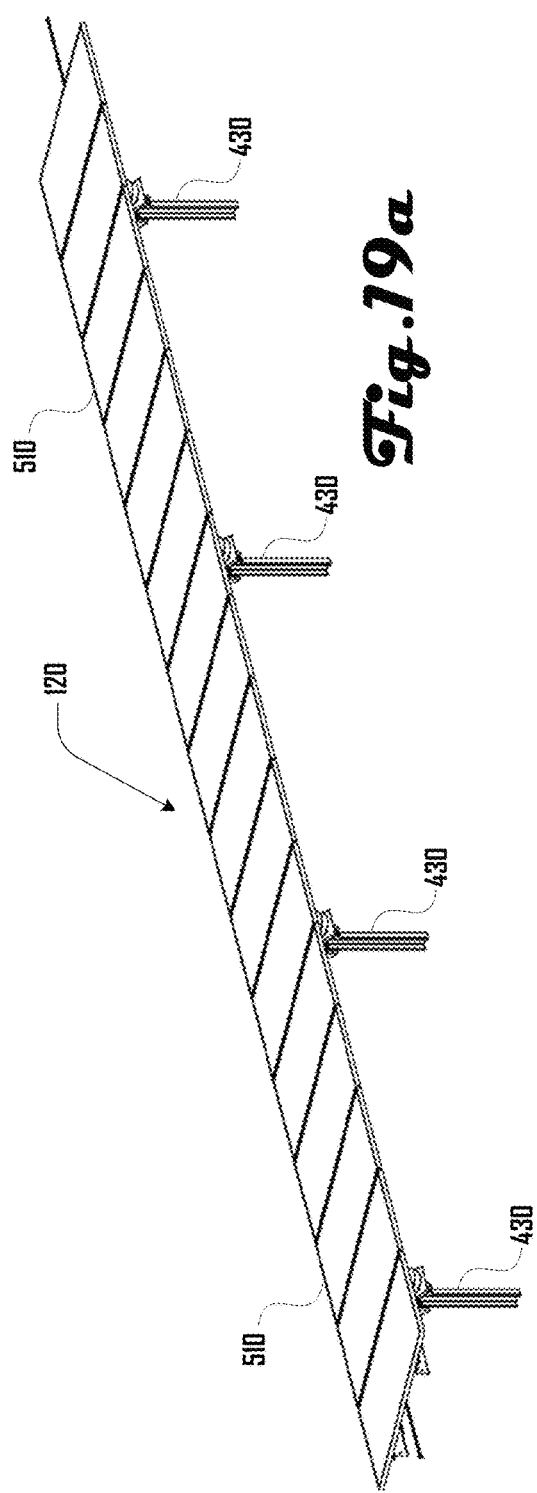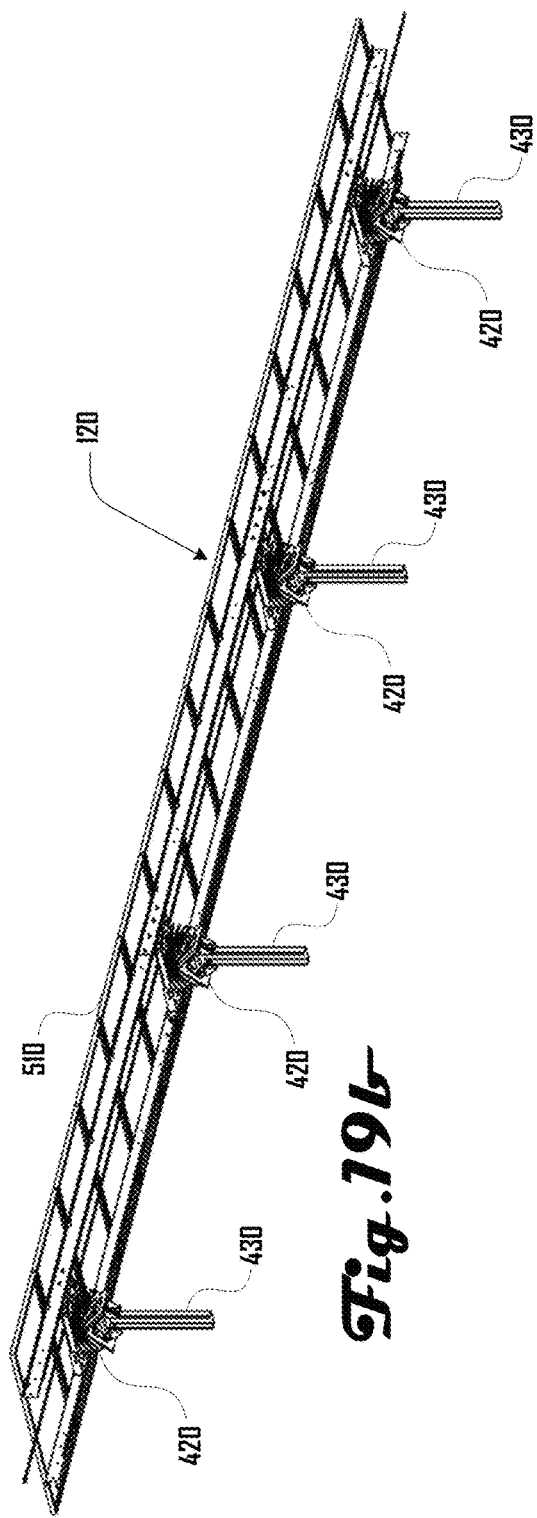

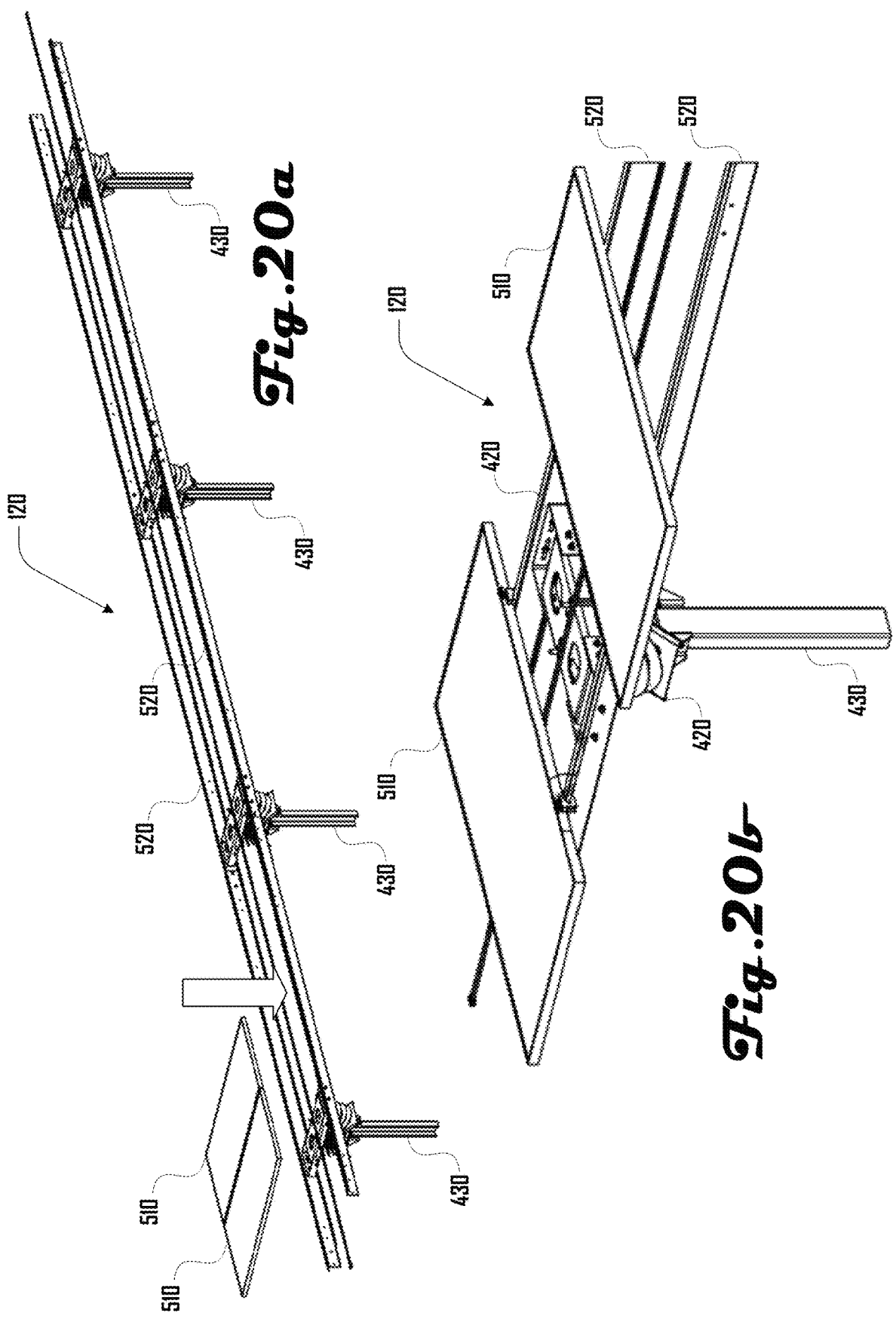

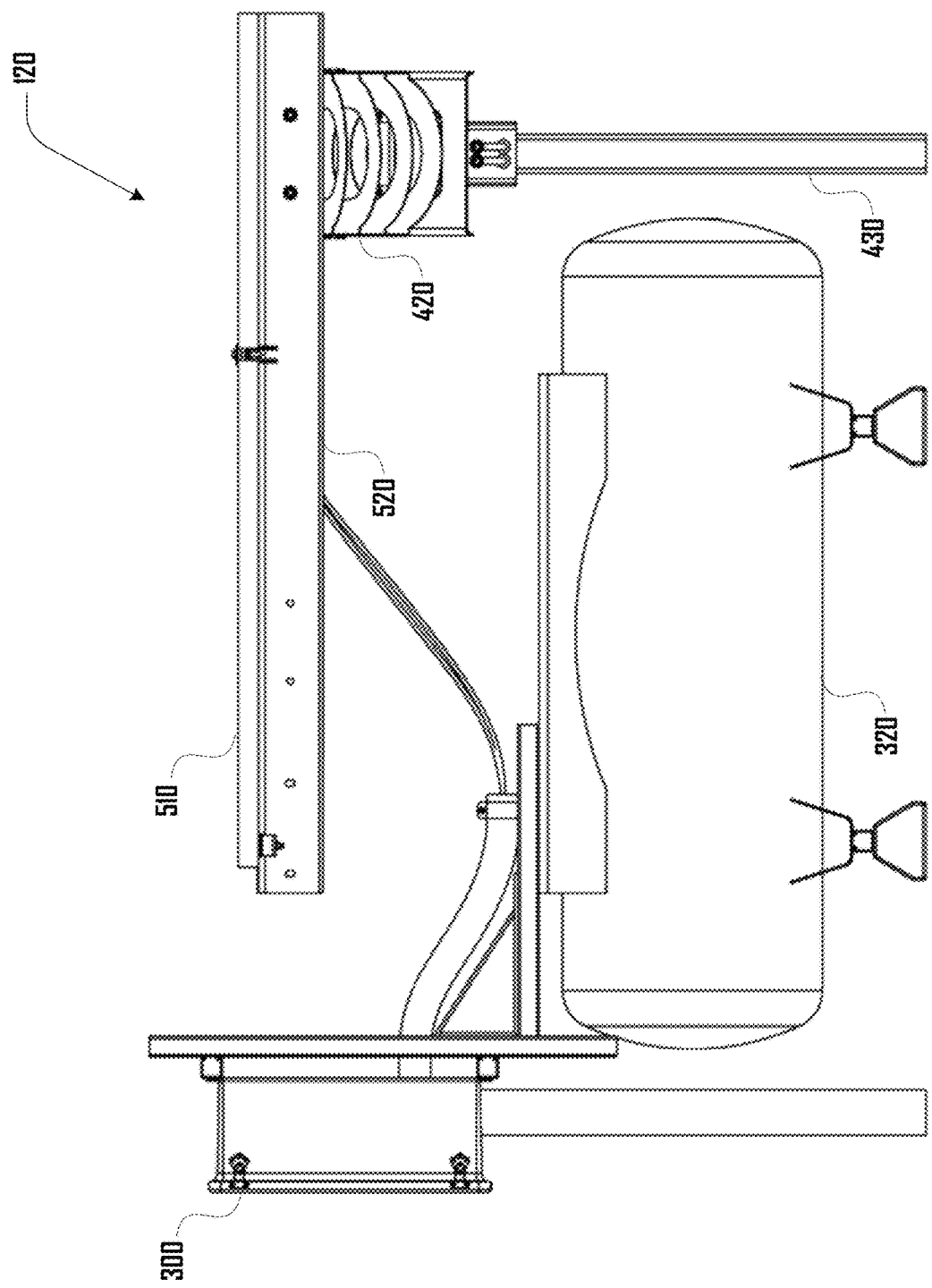

US 10,944,353 B2

PNEUMATIC ACTUATION CIRCUIT SYSTEM AND METHOD

CROSS-REFERENCE TO RELATED APPLICATIONS

This application is a non-provisional of and claims priority to U.S. Provisional applications entitled "PNEUMATIC ACTUATOR SYSTEM AND METHOD" and "PNEUMATIC ACTUATION CIRCUIT SYSTEM AND METHOD" and "SOLAR TRACKER CONTROL SYSTEM AND METHOD" respectively and respectively having application Nos. 62/486,335, 62/486,377 and 62/486,369. These applications are hereby incorporated herein by reference in their entirety and for all purposes.

This application is related to U.S. Non-Provisional applications filed contemporaneously herewith entitled "PNEUMATIC ACTUATOR SYSTEM AND METHOD" and "SOLAR TRACKER CONTROL SYSTEM AND METHOD" respectively. These applications are hereby incorporated herein by reference in their entirety and for all purposes.

This application is also related to U.S. application Ser. No. 15/012,715, filed Feb. 1, 2016, which claims the benefit of U.S. provisional patent application 62/110,275 filed Jan. 30, 2015. These applications are hereby incorporated herein by reference in their entirety and for all purposes.

This application is also related to U.S. application Ser. Nos. 14/064,070 and 14/064,072, both filed Oct. 25, 2013, which claim the benefit of U.S. Provisional Application Nos. 61/719,313 and 61/719,314, both filed Oct. 26, 2012. All of these applications are hereby incorporated herein by reference in their entirety and for all purposes.

STATEMENT REGARDING FEDERALLY-SPONSORED RESEARCH

This invention was made with Government support under contract number DE-AR0000330 awarded by DOE, Office of ARPA-E. The Government has certain rights in this invention.

BACKGROUND

There is an ever-increasing demand for renewable energy in the world today. Solar energy represents an ideal source of clean, renewable energy, as it is inexhaustible and readily available. Capturing and converting the solar radiation striking the surface of the Earth is one of the most effective ways of creating power.

Harnessing solar energy, however, is not without its problems and limitations. Typical solar panels are quite inefficient, with the best, commercially available panels having efficiency ratings of just over 20%. Solar panels are most efficient when the face of the solar panel is perpendicular to the incoming rays of the sun. This typically means adding gearboxes, motors, bearings, and linkage hardware to the mounting of a solar panel and rotating the panel to track the sun as it moves across the sky. These mechanical linkages and electric systems add complexity, requiring maintenance and siphoning power from the system, decreasing the efficiency of the solar energy systems even further.

There exists a need for a solar energy control system which can provide an efficient method of positioning a solar panel while reducing the complexity and cost of the overall system.

BRIEF DESCRIPTION OF THE DRAWINGS

FIG. 19a illustrates a solar tracker row. FIG. 19b illustrates an underside perspective view of the same or similar solar tracker row including four pairs of bellows actuators.

FIG. 20a illustrates how solar panels can be disposed on rails of a solar tracker row. FIG. 20b illustrates solar panels disposed on rails of a solar tracker row, with one panel removed to show a pair of bellows actuators.

FIG. 22 is a close-up, side view of a solar tracker row in accordance with one embodiment.

Figure 1:
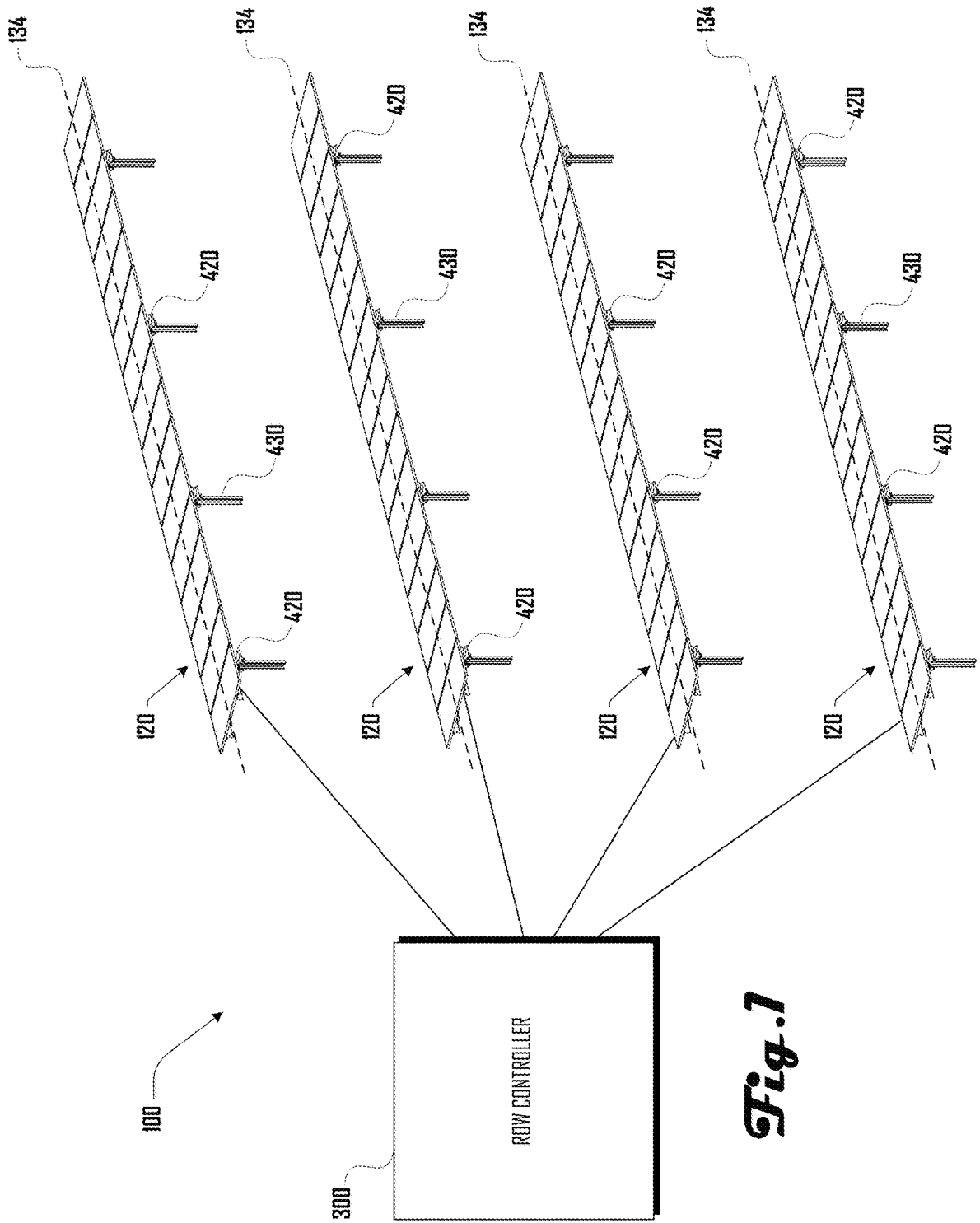
FIG. 1 is an exemplary diagram illustrating an embodiment of a fluidic actuation circuit system that includes a row controller that is operably coupled with a plurality of rows of solar trackers.

It should be noted that the figures are not drawn to scale and that elements of similar structures or functions are generally represented by like reference numerals for illustrative purposes throughout the figures. It also should be noted that the figures are only intended to facilitate the description of the preferred embodiments. The figures do not illustrate every aspect of the described embodiments and do not limit the scope of the present disclosure.

DETAILED DESCRIPTION OF THE PREFERRED EMBODIMENTS

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Techniques described and suggested include methods and systems for controlling the movement of an object, and in particular controlling the rotation of an object such as a solar panel about an axis of rotation.

Various example embodiments are directed to a fluidic system for controlling a rotation of a solar panel about an axis of rotation. In some embodiments, the fluidic system provides a first and second bellows actuators attached to the solar panel. Inflation of the first bellows actuator and deflation of the second bellows actuator causes the solar panel to rotate about the axis of rotation in one direction, and inflation of the second bellows actuator and deflation of the first bellows actuator causes the solar panel to rotate about the axis in an opposite direction.

It should be noted that the terms "inflation" and "deflation" should not be construed to be limiting in any way. As used in the present disclosure, the term "inflation" and related forms of the word will be used to refer to the introduction of fluid to the bellows actuator, causing it to expand or increase in size, and the term "deflation" and related forms of the word will be used to refer to the removal of fluid from the bellows actuator, release of fluid from the bellows actuator, causing it to collapse or decrease in size. A "fluid" can be air, gas, water, hydraulic oil, or any other appropriate substance.

In some embodiments, the fluidic system can have one or more valve circuits, each valve circuit providing a first solenoid valve and a second solenoid valve. A valve circuit can be used to control the inflation and deflation of a bellows actuator by controlling the input and output of fluid from a source of pressurized fluid. For example, the first solenoid valve can be positioned between the source of pressurized fluid and the bellows actuator such that opening the valve can allow the pressurized fluid to flow into the bellows actuator, inflating it. The second solenoid valve can be positioned such that opening the valve causes the release of fluid from the bellows actuator, deflating it.

In some embodiments, the fluidic system can have a first valve circuit dedicated to controlling one or more bellows actuators on an "east" side of a solar panel, and a second valve circuit dedicated to controlling one or more bellows actuators on a "west" side of a solar panel. The terms "east" and "west" as used herein are used as examples only to indicate opposite sides or opposite directions, and should not be construed to be limiting. In some embodiments, the first valve circuit can be completely independent of the second valve circuit. In yet other embodiments, the first valve circuit and second valve circuit may be connected by one or more fluid pathways each controlled by an additional solenoid valve. In these embodiments, opening the additional solenoid valves connecting the first valve circuit and second valve circuit can cause an equalization of pressure between the valve circuits and between the "east" and "west" bellows actuators. Equalizing the pressure between the valve circuits can cause the object to be rotated (e.g., solar panel) to return to a resting or home position, as the pressure in the opposing bellows actuators equalizes.

In some embodiments of the fluidic system, the valve circuits are controlled by one or more electronic control units. An electronic control unit can send electrical signals to the solenoid valves, causing them to open or close appropriately. For example, an electronic control unit can open valves supplying west-side bellows actuators with fluid, causing them to inflate, while simultaneously opening valves to release fluid from east-side bellows actuators, causing them to deflate. Inflating the bellows actuators on the "west" side of the solar panel while deflating the bellows actuators on the "east" side of the solar panel will cause the solar panel to rotate toward the "east."

In some embodiments, the fluidic system will rotate the solar panel based on the current position of the sun. The current position of the sun can be obtained through the use of a sensor, solar tracking algorithms, astronomical plots of the sun's position, or through any other appropriate method for determining a current position of the sun. The electronic control unit can use the information specifying the current position of the sun to determine which valves to open or close in order to rotate the solar panel such that it is an appropriate position relative to the sun. In some embodiments, rather than determining the position of the sun, the electronic control unit can rely on a sensor designed to sense an amount of light or an amount of current output by the solar panel, and move the solar panel into a position such that the amount of sunlight striking the solar panel approaches a maximum or a desired level.

In some embodiments, the electronic control unit will command inflation or deflation of the bellows actuators to achieve a desired level of fluid pressure in the bellows actuators. For example, during high wind conditions, the electronic control unit may increase the fluid pressure in one or more bellows actuators to increase the "stiffness" of the system, such that it is not as susceptible to movement or damage from the wind.

The electronic control units, optional sensors, solenoid valves, and valve circuits described herein can be assembled into a system and collectively referred to as a row controller. A row controller can be connected to, and provide commands for, one or more bellows actuators connected to a row of solar panels in an array of solar panels. It should be noted that a row of solar panels as described herein can contain only a single solar panel, and an array of solar panels can contain only a single row. A row controller may be connected to a single bellows actuator, a pair of bellows actuators mounted on either side of an axis of rotation of a solar panel, or any appropriate number of bellows actuators in an array of solar panels. An array of solar panels may be controlled by one or more row controllers. As used herein, any number of row controllers controlling any number of fluidic, bellows actuators can be referred to collectively as a fluidic actuation control system.

Turning now to the figures, various embodiments of the fluidic actuator control system will be described in more detail. FIG. 1 is an exemplary diagram illustrating an embodiment of a fluidic actuation circuit system 100 that includes a row controller 300 that is operably coupled with one or more rows of solar trackers 120. As used herein, the terms "solar tracker row," "rows of solar trackers," and "row" will be used interchangeably.

The solar tracker rows 120 can comprise a plurality of solar (photovoltaic) panels that are positioned via one or more fluidic actuators 420. The solar tracker rows 120 can be coupled to the ground, over water, or the like, in various suitable ways including via a plurality of posts 430.

The row controller 300 can be configured to control the fluidic actuators of the solar tracker rows 120 to generate rotation of the solar panels along a lateral axis of rotation 134 (the length of the rows) and/or modify a tension or rigidity of the actuators. In various embodiments, the solar tracker rows 120 can be configured to track a position of the sun; move to a position that provides maximum light exposure; reflect light to a desired location (e.g., a solar collector); move to a stow position, and the like.

While various examples shown and described herein illustrate a system having various pluralities of solar tracker rows 120, these should not be construed to be limiting on the wide variety of configurations that photovoltaic panels and fluidic actuators that are within the scope and spirit of the present disclosure. For example, some embodiments can include a single row or any suitable plurality of solar tracker rows, including one, two, three, four, five, six, seven, eight, nine, ten, eleven, twelve, fifteen, twenty, twenty five, fifty, one hundred, and the like. Additionally, a given solar tracker row can include any suitable number of fluidic actuators and photovoltaic panels, including one, two, three, four, five, six, seven, eight, nine, ten, eleven, twelve, fifteen, twenty, twenty five, fifty, one hundred, two hundred, five hundred, and the like. Rows can be defined by a plurality of physically discrete solar tracker units. For example, a solar tracker unit 120 can comprise one or more actuators coupled to one or more photovoltaic panel.

In some preferred embodiments, the solar tracker rows 120 can extend in parallel in a north-south orientation, with the actuators of the rows configured to rotate the photovoltaic panels about an east-west axis of rotation 134. However, in further embodiments, rows can be disposed in any suitable arrangement and in any suitable orientation. For example, in further embodiments, some or all rows may not be parallel or extend north-south. Additionally, in further embodiments, rows can be non-linear, including being disposed in an arc, circle, or the like. Accordingly, the specific examples herein (e.g., indicating "east" and "west") should not be construed to be limiting.

It should be noted that, although many of the examples presented herein discuss solar energy systems (that is, the movement of a solar panel about an axis of rotation), the systems and methods described could be applied to any appropriate type of object to be moved or rotated about a point or an axis of rotation. Non-limiting examples include systems for positioning satellite dishes, security cameras, reflective mirror panels for redirecting light, and the like. Similarly, all other specific examples herein should likewise not be considered to be limiting on the wide variety of configurations that are within the scope and spirit of the present disclosure.

Figure 2:
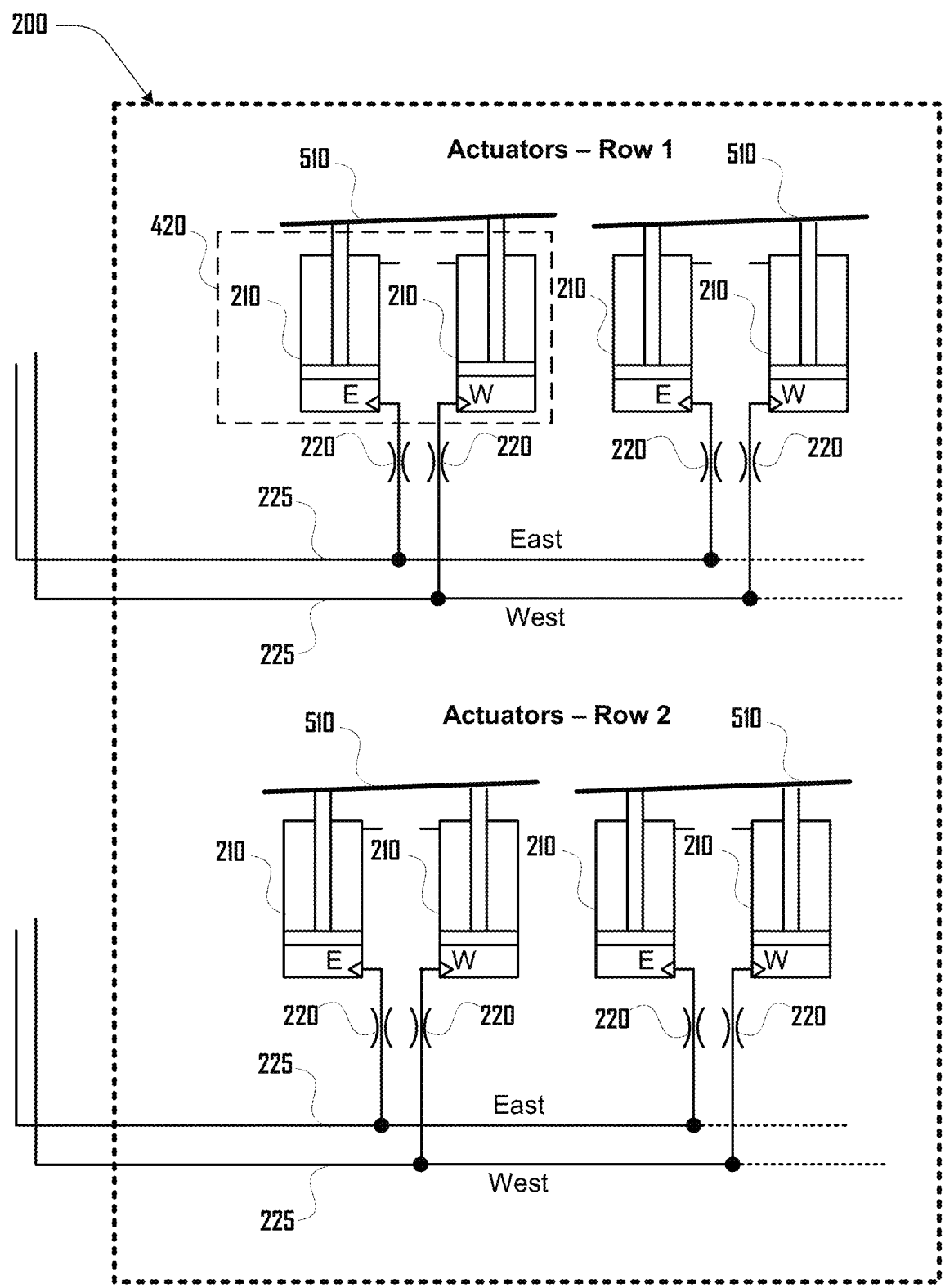
FIG. 2 is an exemplary illustration of a set of rows, including a first and second row, with each row comprising a first and second east and west bellows of a respective first and second fluidic actuator.

FIG. 2 is an exemplary illustration of a set of solar tracker rows 200, including a first row and second row and the corresponding bellows 210 and fluidic tubing 225. Each row includes a set of fluidic supply lines 225 supplying pressurized fluid to a set of bellows 210. The movement of the bellows 210 produced by the introduction or release of fluid from the bellows 210 causes a set of photovoltaic panels 510 to rotate about an axis of rotation, tilting the panels 510 in one direction or the other. In the embodiment shown, each solar tracker row has one or more "east" bellows 210 and one or more "west" bellows 210. A fluidic actuator 420 is defined as being comprised of at least one "east" bellows 210 and at least one "west" bellows 210. The air moving through the fluidic supply lines 225 may pass through one or more flow restriction devices 220. The purpose of a flow restriction device 220 can be to reduce fluid flow, increase fluid velocity, provide a mechanism for precision metering of the fluid, and the like.

In various operating scenarios, pressurized fluid can be supplied to each of the "east" bellows 210 in the system through fluidic supply lines 225, causing the "east" bellows 210 to expand, pushing up on the "east" side of the panels 510, causing the top surface of the panels 510 to tilt in the direction of the "west" side. Depending on the desired angle of tilt for the panels 510, as well as the desired tension in the bellows 210, fluid may be released from each of the "west" bellows 210 simultaneously with fluid being introduced to the "east" bellows 210, controlling the rate or rotation of the panel 510, as well as the tension or desired pressure of the bellows 210.

In some embodiments, the bellows 210 can be in the form of an elastic vessel which can expand with the introduction of a pressurized fluid, and which can collapse or shrink when the pressurized fluid is released. The term 'bellows' as used herein should not be construed to be limiting in any way. For example the term 'bellows' as used herein should not be construed to require elements such as convolutions or other such features (although convoluted bellows 210 can be present in some embodiments). As discussed herein, bellows 210 can take on various suitable shapes, sizes, proportions and the like.

The bellows 210 can be mounted on opposite sides of an axis of rotation 134 (FIG. 1); that is, an "east" set of actuators 210 may be mounted on an "east" side of an axis of rotation 134, and a "west" set of actuators 210 may be mounted on a "west" side of the same axis of rotation 134. The panels 510 may be mounted such that they pivot or rotate about the axis of rotation 134.

The set of solar tracker rows 200 can be controlled by a row controller 300 (see FIG. 1). In some embodiments, a row controller 300 is a collection of electronic control units, solenoid valves, valve circuits, and optional sensors used in controlling the movement and position of the set of solar tracker rows 200. FIGS. 3 through 16 illustrate example embodiments of row controllers which can be used for the control of a set of solar tracker rows 200.

Figure 3:
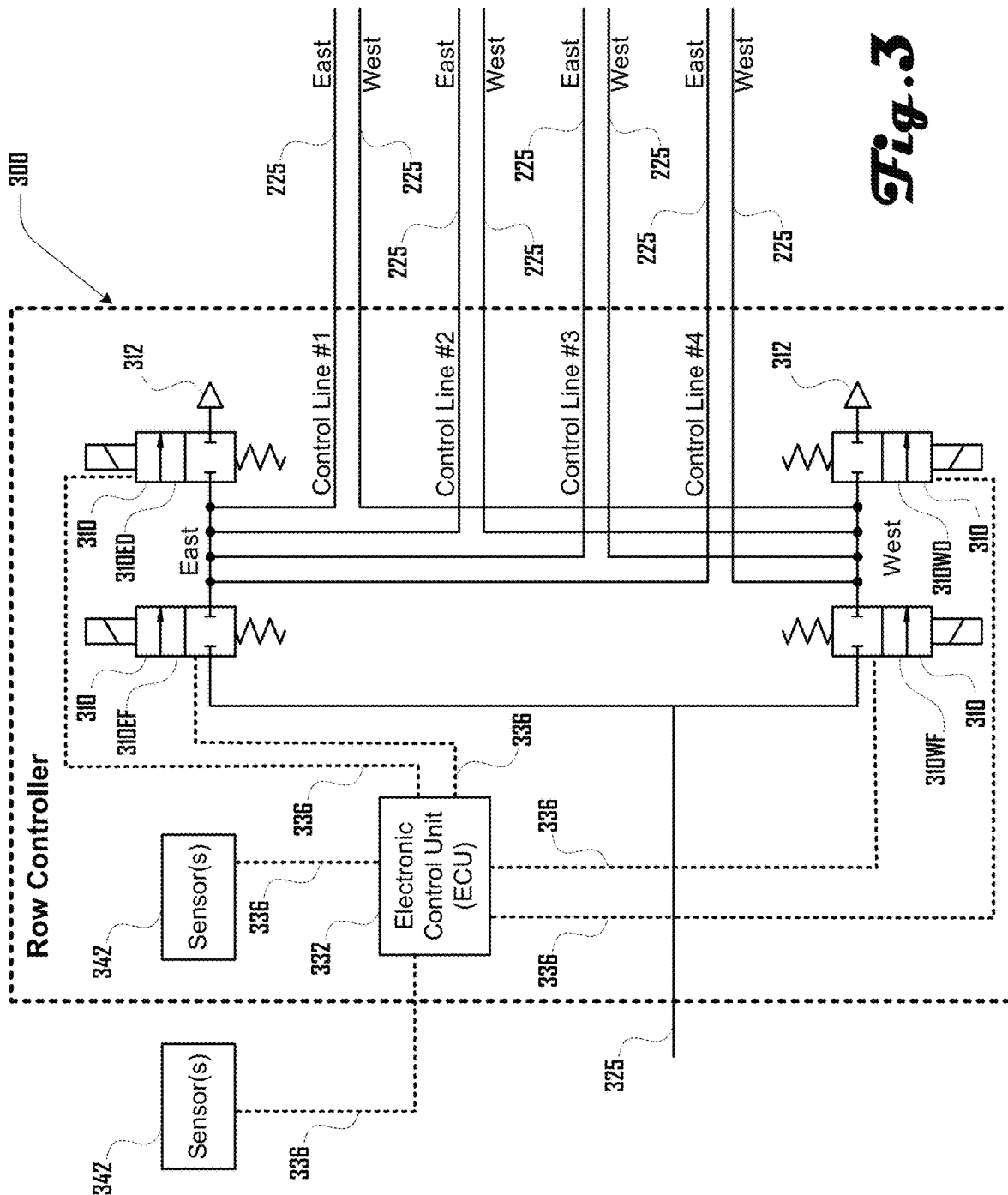
FIG. 3 is an exemplary illustration of an embodiment of a row controller for use with the fluidic actuation circuit system, providing an electronic control unit and optional sensors.

FIG. 3 is an exemplary illustration of an embodiment of a row controller 300 for use with the fluidic actuation circuit system, providing an electronic control unit 332 and optional sensors 342. It should be noted that the reference designator 300 will be used throughout the specification to refer to all row controller embodiments, while the same reference designator will be accompanied by a letter (such as 300A through 300M) to refer to specific variations, configurations, or embodiments of a row controller 300.

Returning now to FIG. 3, a row controller 300 can include a plurality of solenoid valves 310 which can be used to control the flow of a pressurized fluid into and out of the row controller 300. In some embodiments, a source of pressurized fluid 325 supplies pressurized fluid to a subset of solenoid valves 310. For example, the pressurized fluid can be supplied to or removed from at least one solenoid valve 310 on each of an "east" and "west" side of a valve circuit.

It should be noted that the reference designator 310 will be used throughout the specification to refer to a solenoid valve, while the same reference designator accompanied by one or more letters will be used when appropriate to refer to solenoid valves 310 with a specific purpose or in a specific location. For example, the reference designator 310EF is used to refer to a solenoid valve 310 located in the "east" portion of a valve circuit (E), and used for the purpose of filling (F), or supplying pressurized fluid to, one or more "east" bellows 210 (FIG. 2). As another example, the reference designator 310WD is used to refer to a solenoid valve 310 located in the "west" portion of a valve circuit (W), and used for dumping (D), or releasing pressurized fluid from, one or more "west" bellows 210 (FIG. 2).

For example, returning again to FIG. 3, the source of pressurized fluid 325 can supply fluid to a solenoid valve 310EF. Solenoid valve 310EF can be in an "open" or "closed" configuration. In an "open" configuration, the solenoid valve 310EF will allow the pressurized fluid to flow through to enter one or more "east" control lines 225, supplying pressurized fluid to one or more "east" bellows 210 (FIG. 2). As described herein, when a bellows takes in pressurized fluid, it will expand, causing an attached object (a solar panel, for example) to be pushed or rotated toward the "west." When solenoid valve 310EF is in a "closed" configuration, the pressurized fluid is not allowed to pass through valve 310EF in either direction.

Similarly, solenoid valve 310ED can be in an "open" or "closed" configuration. In an "open" configuration, pressurized fluid from one or more "east" control lines 225 can flow through solenoid valve 310ED to be exhausted through a vent 312 connected to solenoid valve 310ED. As described herein, when pressurized fluid is released or removed from a bellows 210 (FIG. 2), the bellows 210 (FIG. 2) will "deflate" or reduce in size, allowing an attached object (a solar panel, for example) to be pushed back toward the "east." When solenoid valve 310ED is in a "closed" configuration, the pressurized fluid is not allowed to pass through valve 310ED in either direction, and the pressure in the bellows 210 (FIG. 2) can be held constant.

Similar operations can be performed on the "west" side of the valve circuit using solenoid valves 310WF (west fill) and 310WD (west dump). Opening solenoid valve 310WF allows pressurized fluid to flow into one or more "west" control lines 225 to expand one or more "west" bellows 210 (FIG. 2), while closing solenoid valve 310WF stops the flow of pressurized fluid in both directions. Opening solenoid valve 310WD allows pressurized fluid from one or more "west" control lines 225 to be exhausted through vent 312 connected to solenoid valve 310WD, and closing solenoid valve 310WD stops the release of pressurized fluid and maintains the pressure in one or more "west" bellows 210 (FIG. 2).

It should be noted that while many of the examples presented herein use pressurized air as the "pressurized fluid" for controlling the fluidic actuators 420 (FIG. 2), any appropriate fluid may be used. A person of skill in the art will understand that pressurized air may be vented or exhausted from a valve circuit into open air, while a pressurized liquid such as hydraulic oil, water, or the like, would likely be collected after being exhausted and reintroduced into the source of pressurized fluid. Similarly, while solenoid valves 310 are used as one specific example herein, in further embodiments, any suitable valve or valve assembly can be used in place of or in addition to solenoid valves 310 including a non-solenoid type of valve such as a pneumatic valve, shape memory alloy valve, thermostatic or wax-valve, piezo valve, and the like. Pumps or compressors may also be used in place of or in addition to solenoid valves 310.

The solenoid valves 310 of row controller 300 can be opened and closed by receiving an appropriate electrical impulse (command signal) from an electronic control unit (ECU) 332. The ECU 332 can include a processor and memory, and can execute instructions from a software program (not shown) to send command signals to the solenoid valves 310 over electrical connections 336. The ECU 332 can receive inputs from one or more optional sensors 342, which can be co-located with the row controller 300 or external to the row controller 300. For example, in an embodiment, data obtained from a clock and a defined or determined location can be used to identify a location of the sun by referencing astrological charts available to the ECU 332. In another embodiment, the ECU 332 can receive information from a sensor 342 which senses light, and, based at least in part on the information from the light sensor, can command the solenoid valves 310 to allow the fluidic actuators 420 (FIG. 2) to move an attached solar panel until it is exposed to increased sunlight. In a further example embodiment, the ECU 332 can receive information from a sensor 342 which senses the amount of current traveling through a circuit, and can command the solenoid valves 310 such that the solar panel is moved into a position such that a solar array outputs increased current. The sensors presented herein are examples only and are not meant to be limiting. The ECU 332 can receive inputs from any type or number of optional sensors 342, or may not receive inputs from sensors 342 at all.

Various suitable control systems can be used to control one or more fluidic actuators 420 (FIG. 2), which may be associated with one or more trackers of one or more solar tracker rows 120 (FIG. 1). Such controls can comprise temperature and humidity abatement via pneumatic venting, which can include opening both fill and vent valves in a row controller 300 and/or using an orificed connection for an array controller. Further control system embodiments can comprise modifying/controlling $V_{oc}$ (open circuit voltage), which can be desirable for to reducing design constraints (e.g., string length) and improve cost of inverters, combiner boxes, wiring, and the like. Some embodiments can include modifying/controlling $I_{sc}$ (short circuit current), which can reduce design constraints (e.g., current) and can improve the cost of inverters, combiner boxes, wiring, and the like. Still further embodiments can comprise modulating the tracker position to increase convection and therefore increase operating voltage and energy output.

Some embodiments can comprise off-angle tracking for electrical current health inspection. For example, off-angle tracking during high irradiance hours can provide an indication of string level health or health of a row controller's 300 worth of panels. In some embodiments, such a determination can comprise measuring a dip in current output when portions of an array's tracker are pointed away from the sun. Where modules are broken, wiring is wrong, or the like, less of a dip would be observed, which could indicate an issue with the system in that portion. On the other hand, where modules are healthy, larger dips during off-sun tracking would be observed, which could indicate that portion of the system being healthy. Further embodiments can comprise a pressure/position check to monitor bellows for material degradation or other defects.

Some embodiments can comprise variable peak pressures. In one example, material creep reduction can include adjusting the control algorithm to have the maximum bellows actuator pressure dependent on external loads (e.g., reduce pressure when wind speed is low and increase pressure as wind speed increases). The reduced average pressure over time can limit material creep. In another example, a constant bellow stress function can include increasing pressure at a flat configuration (e.g., parallel to the ground) to provide more stiffness in stow, which can also provide better accuracy. Bellow stress can be inversely proportional to angle, and proportional to pressure. High pressure at low angle in some embodiments can allow for roughly constant bellow material stress throughout the range of motion of the actuator.

Some embodiments can use pulse width modulation (PWM) to control valves instead of calculated open-time in order to optimally utilize valve cycle life and minimize tracker twist due to long valve open times. Further embodiments can be configured to monitor pressures/angles of one or more fluidic actuators 420 (FIG. 2) to determine a leak location. For example, leaks can be predicted if pressures/angles in a particular row or tracker are changing differently than other rows/trackers, or differently than expected based on temperature variations and other factors. This can allow leaks to be located on the row-level. Leaks can be located even more precisely, in still further embodiments, with more sensors and/or by learning the system response to leaks as a function of leak location, and adapting control code to recognize patterns that are characteristic of specific leak locations.

Some embodiments can comprise solar-string-powered controls with no battery backup. For example, the array can be used to power controls. In one configuration, a large array can have significant available energy even early in the morning before inverters start. A 50 kW array (e.g., including eight solar tracker rows 120) with 10 W/m² irradiance can generate 500 W which can be sufficient to power control systems. Even cloudy days can have more than enough power to run a compressor. Such embodiments can be employed with or without battery backup. Additionally, the control system can be configured to move one or more tracker of an array away from vulnerable positions before energy is lost for the day. In such examples, a stow-on-power-loss function can be desirable.

While backup power can be provided via a battery, further embodiments can comprise a wind turbine to provide backup power (or backup air supply) during wind events combined with power outages. Risks to a solar array structure can be greatest during extreme wind events, and using wind to provide energy can help guarantee that energy is available when needed.

It should be noted that the ECU 332, electrical connections 336, and, optionally, sensors 342 can be assumed to be present in each of the example row controller embodiments of FIGS. 4-16. However, for the purposes of clarity, these components are not captured in FIGS. 4-16. The intent of FIGS. 4-16 is to illustrate alternate embodiments (configurations) of the solenoid valves and valve circuits. It should also be noted that the dashed box defining the outlines of the row controller 300 in the figures herein is not meant to be limiting in any way. In some embodiments, the row controller 300 can be physically implemented in any number of separate modules. In other embodiments, the row controller 300 can be considered to encompass the source of pressurized fluid itself, rather than receiving the pressurized fluid as an input to the system.

Figure 15:
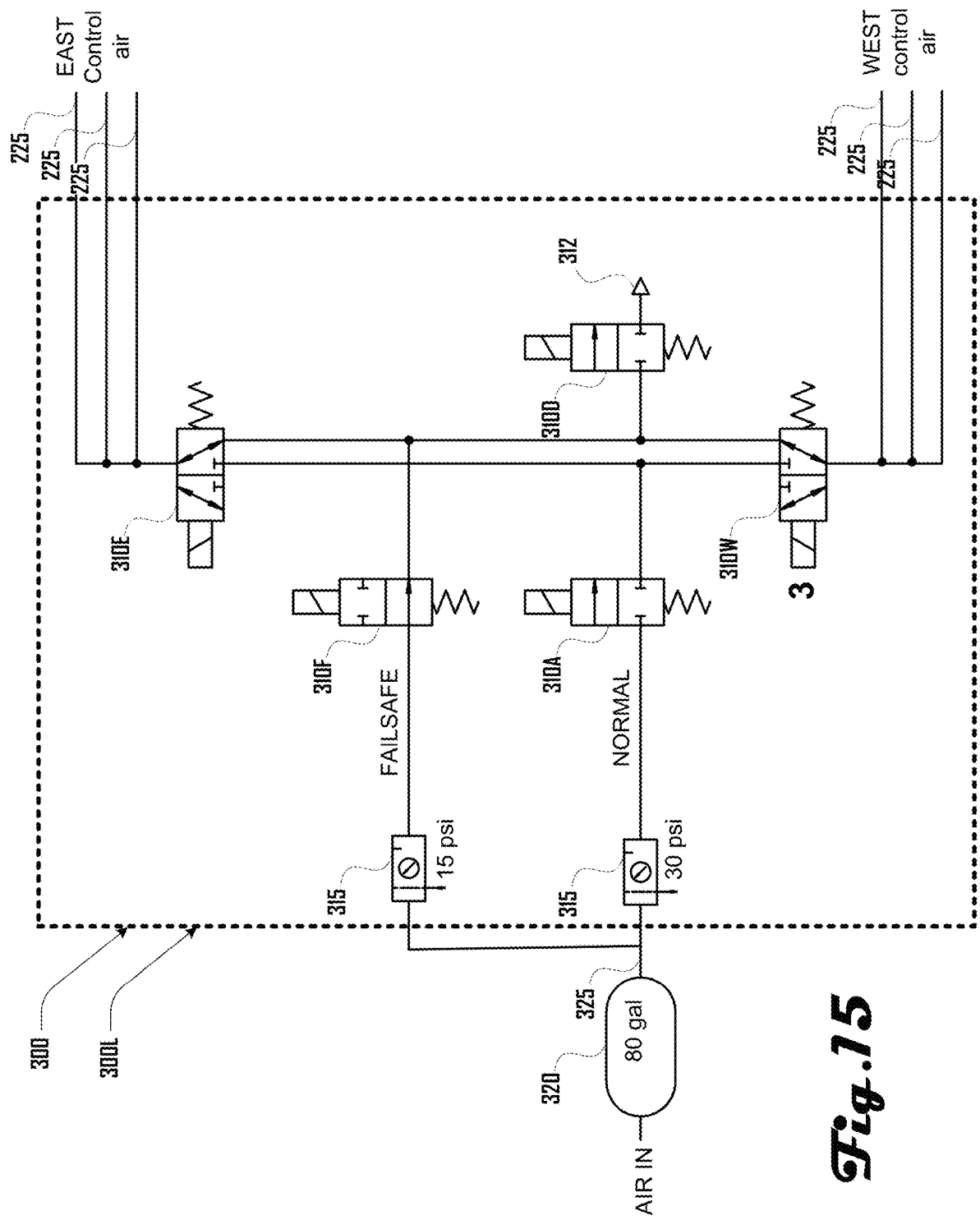
Figure 16:
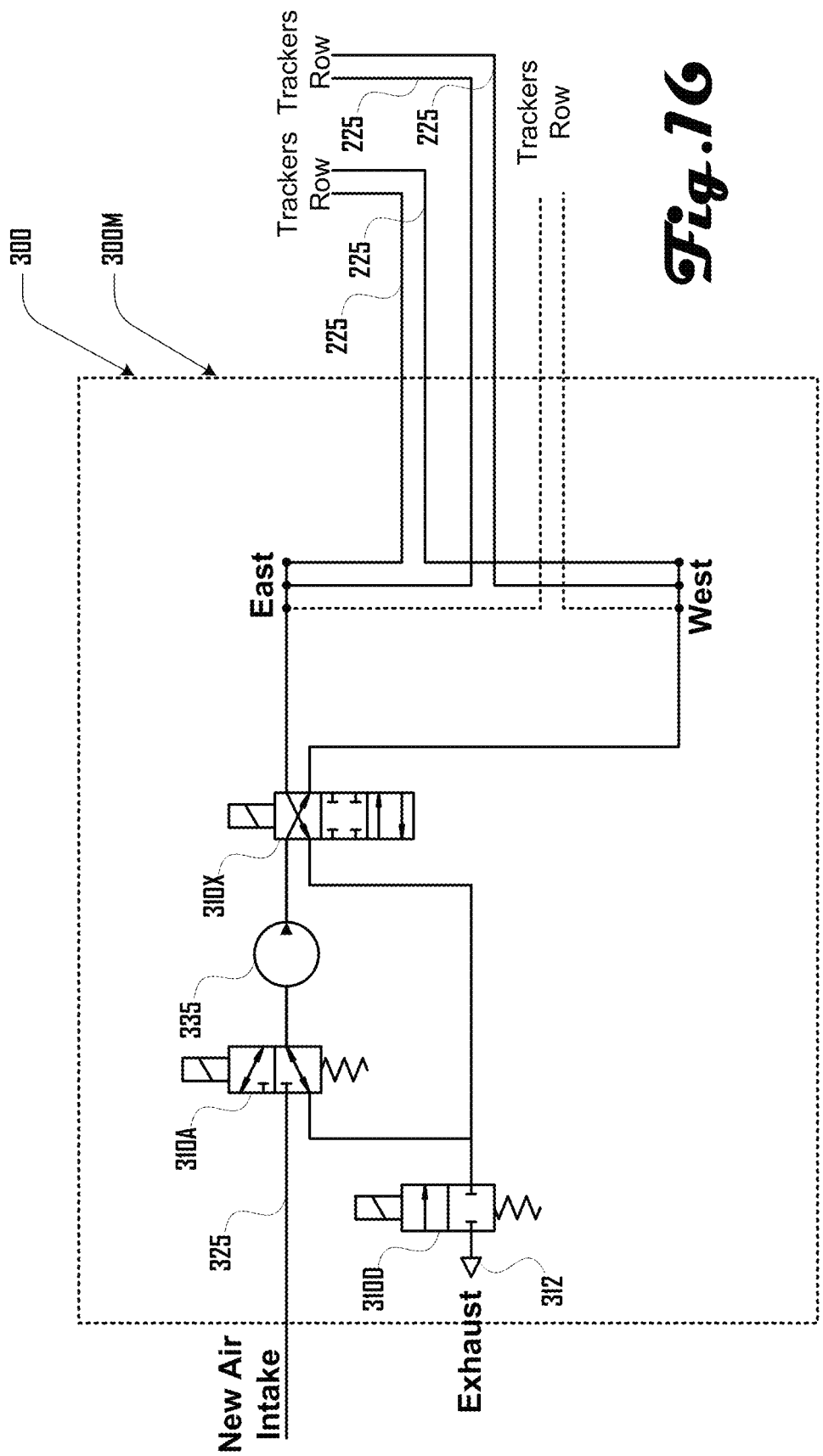

FIGS. 4-16 illustrate example embodiments of a row controller providing various features and configurations of solenoid valves. FIGS. 4-10 illustrate row controller embodiments based the use of four primary solenoid valves, with two solenoid valves each used in both an "east" valve circuit and a "west" valve circuit, allowing independent operation of each valve circuit. FIGS. 11-15 illustrate row controller embodiments based on a reduced number of solenoid valves compared to the embodiments of FIGS. 4-10. FIG. 16 illustrates a row controller embodiment in which a single solenoid valve is used in conjunction with a bi-directional pump for providing pressurized fluid to, or removing fluid from, either an "east" valve circuit or a "west" valve circuit.

The examples presented, and the following discussion, are based on a pneumatic (or pressurized air) system, but, as described herein, any appropriate pressurized fluid system can be used. Pneumatics can introduce and/or remove fluid from one or more fluidic actuators 420 (FIG. 2). For example, pneumatics can actuate a plurality of fluidic actuators 420 (FIG. 2) associated with a solar tracker. In further examples, pneumatics can actuate a plurality of solar trackers disposed in one or more row. The pneumatics system can comprise a plenum structure for a control air distribution system (CADS) harness, which in some embodiments can include a high flow capacity main line with flow restrictions on bellow branches to maintain main line pressure on long rows. In some embodiments, pneumatic routing can be disposed on the "north" side of all fluidic actuators 420 (FIG. 2) of a tracking system.

Flow restrictions, restrictive elements, orifices, and the like can be used to control, meter, or limit fluid flow rates at various desirable locations in a fluidic actuation circuit 100. Such a restriction or orifice can be implemented as an orificed set screw in some examples. Many other embodiments such as molded restrictions, pressed restriction inserts, overmolded restriction inserts, circuitous paths, long lengths of tubing, or the like, can be used to achieve the same effect in further examples. Use of a restrictive element at a nozzle of a bellows 210 can limit and/or balance flow into a pneumatically connected group of bellows 210 or volumes. Lower flow across nozzles of bellows 210 can reduce pressure drop along pneumatic harnesses connecting bellows 210, which can cause actuators 420 to move together in unison. By causing large groups of actuators 420 to move in unison, in some embodiments, larger arrays of trackers 120 can be connected together on a single pneumatic circuit while maintaining desired pointing accuracy. Counter-intuitively, use of nozzle restrictions at bellows 210 can decrease the total time duration for motion of a pneumatically connected group as it moves in unison rather than in succession.

In some embodiments, flow restrictions on some or all fluidic actuator 420 (FIG. 2) lines can be desirable for equalizing flow (and therefore motion rate) of some or all of the fluidic 420 (FIG. 2) actuators in a row, and across rows of differing lengths and differing pneumatic impedance. The restrictions can be tuned to equalize flow within a desired percentage range in accordance with various embodiments. Such configurations can equalize motion rate for some or all of the fluidic actuators 420 (FIG. 2) (keeps panels matched) and can allows for more arbitrary field layout of pneumatic tubing. Various embodiments can include a hermetic connector to fluidic actuator 420 (FIG. 2) polymer-weld. Further embodiments can comprise air brake tubing and fittings for a solar application. In some embodiments, the pneumatic system, using low pressure, can pump between control air distribution system (CADS) channels rather than using a source/exhaust system. For example, the system can comprise a row controller pump between CADS channels.

Figure 6:
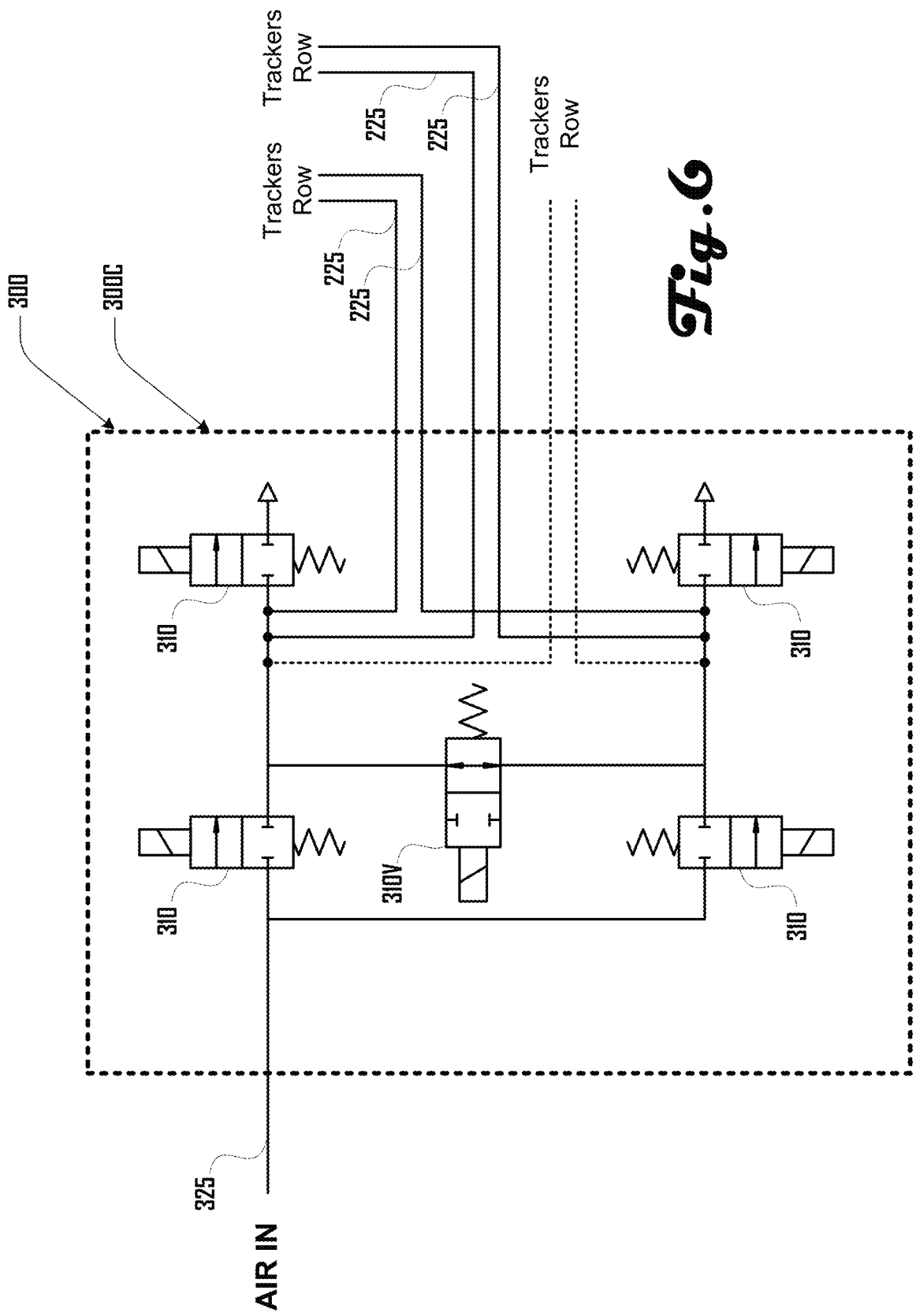

In various embodiments, it can be desirable for fluidic actuators 420 (FIG. 2) to be configured to stow on power loss. In other words, where the pneumatics system loses power, one or more fluidic actuators 420 (FIG. 2) of the system will default to a desired safe stow position. For example, using a cross-over valve, the valve can be "normally open" with a spring-return. It is held closed when the system is powered. When power is lost the cross-over valve opens. This can create a "stow on power loss" function for the system. In some examples, a cross-over valve can connect the east and west valve circuits. Air from higher pressure bellows 210 (FIG. 2) can flow to lower pressure bellows 210 (FIG. 2). The cross-over valve can reduce total system air use by up to 50%, in various embodiments. FIG. 6 illustrates an embodiment of a row controller 300 featuring a "stow on power loss" function.

Figure 8:
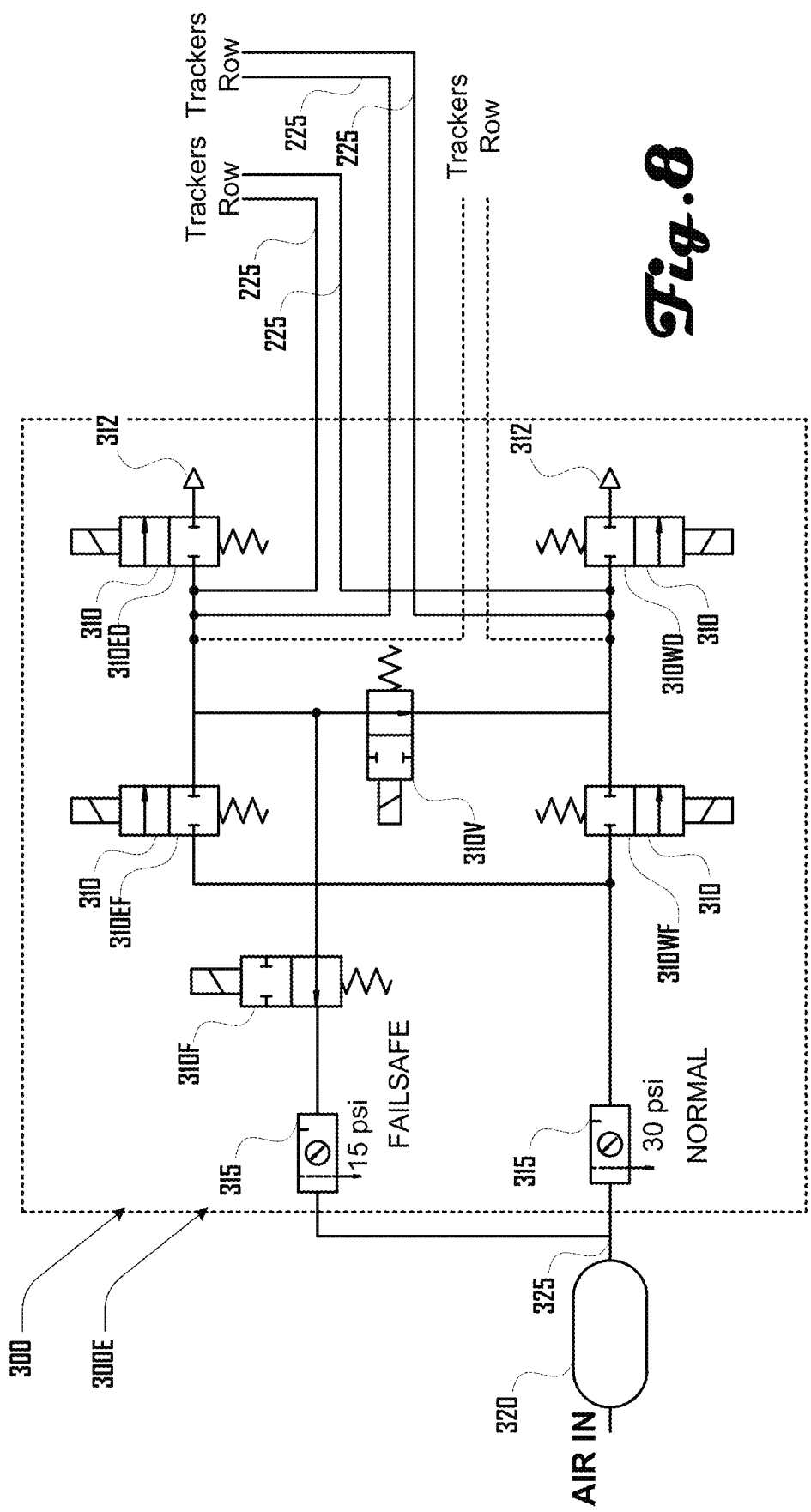

Some embodiments can comprise a replenish-leaks-on-power-loss function. For example, an additional low pressure regulator can be added to a row controlled or other portion of the system, with a normally-open valve connecting it to the manifold cross-over. The valve is held closed when the system is powered. When power is lost the valve opens, replenishing any leaks from an attached high-pressure air tank. This can allow the system to maintain a stow position for an extended period of power-loss, even with leaks in the system. FIGS. 8 and 15 illustrated embodiments of row controllers 300 featuring a "replenish-leaks-on-power-loss" function.

Further embodiments can comprise a wind flutter damper-compressor. For example, some configurations can use the fluttering motion of the solar tracker row induced by wind to operate a compressor to augment an air supply. One or more pistons (or bellows) distributed throughout the tracker can generate additional makeup air to reduce energy consumption while also limiting the magnitude of any fluttering behavior preventing resonance. Additionally, some embodiments can comprise a double 5/2 valve arrangement, which can include a source or exhaust connected to east-output or west-output. Also, while various embodiments herein can comprise on/off valves, further embodiments can comprise proportional valves in place of and/or in addition to on/off valves. Accordingly, the example valves herein should not be construed to be limiting on the variety of alternative valve configurations that are within the scope and spirit of the present disclosure.

Figure 4:
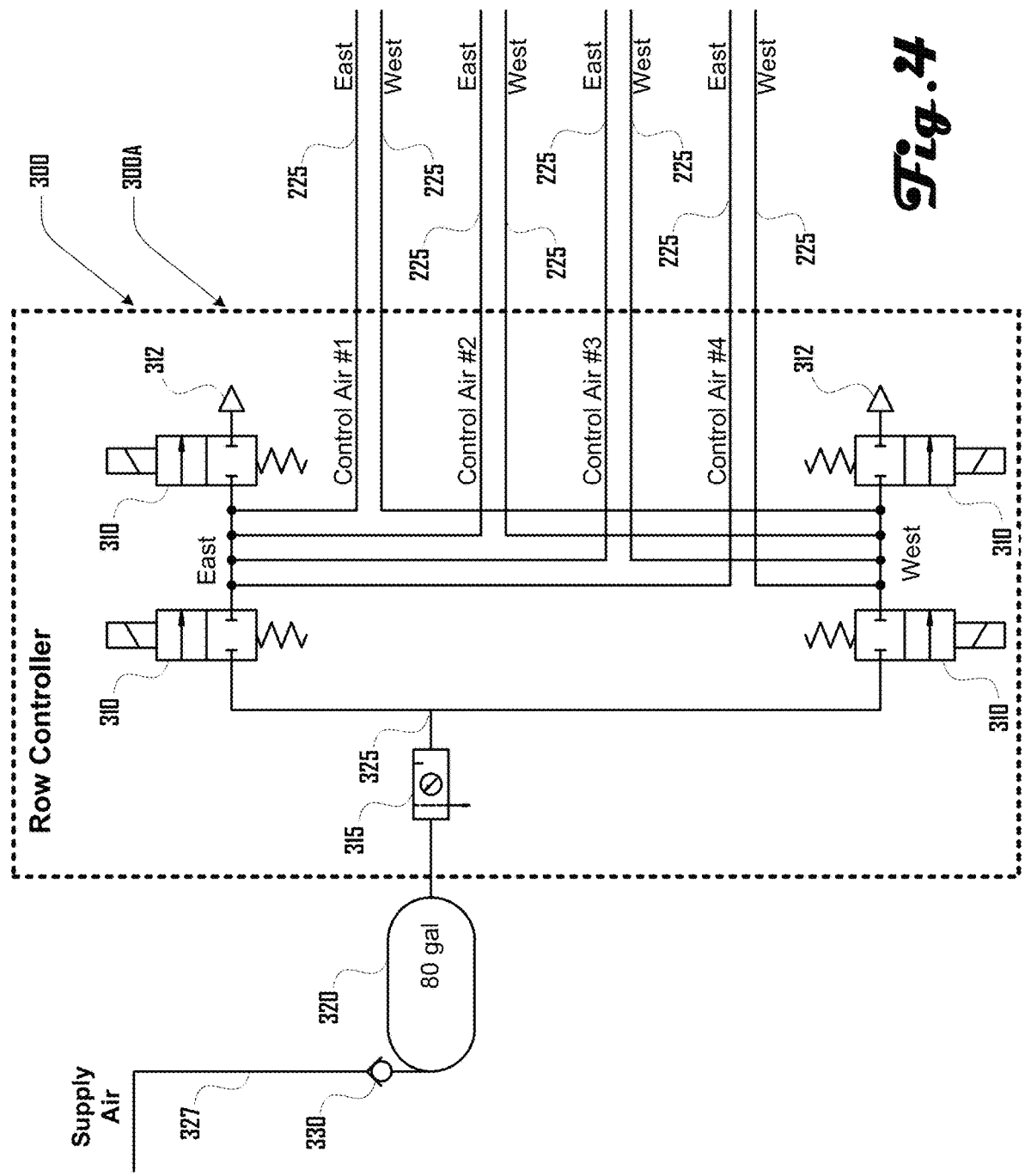
FIGS. 4, 5, 6, 7, 8, 9, 10, 11, 12, 13, 14, 15 and 16 illustrate example embodiments of a row controller providing various features and configurations of solenoid valves.

FIG. 4 illustrates an embodiment of a row controller 300A similar to the configuration presented in FIG. 3. Pressurized air 325 is input to a set of solenoid valves 310 arranged into "east" and "west" valve circuits. As described herein, the solenoid valves 310 are arranged such that they can provide the following functions to the row controller 300A: fill east, dump east, fill west, and dump west. In some embodiments of an operating scenario, an ECU 332 (FIG. 3) determines a need to rotate a solar panel 510 (FIG. 1) or similar object about an axis of rotation 134 (FIG. 1). For example, the ECU 332 can determine a need to rotate one or more solar panels 510 (FIG. 1) about an axis of rotation 134 (FIG. 1) such that the top surface of each solar panel 510 (FIG. 1) stays substantially perpendicular to the direction of incoming solar rays as the sun moves across the sky from east to west, requiring a rotation of the solar panel 510 (FIG. 1) toward the west. The ECU 332 can therefore command a solenoid valve 310 to open such that pressurized air flows into the "east" control lines 225, causing one or more "east" bellows 210 (FIG. 2) to inflate and expand, tilting the solar panel toward the "west" direction. The ECU 332 can also determine that pressure in the "west" bellows 210 (FIG. 2) should be released to allow the "west" bellows 210 (FIG. 2) to deflate and collapse, further allowing a rotation toward the "west."

In the embodiment shown in FIG. 4, control of the "east" valve circuits is independent from control of the "west" valve circuits. This allows for the simultaneous inflation or deflation of both the "east" and "west" bellows 210 (FIG. 2), such that the overall tension in the mounting system can be controlled. For example, in the event of a wind storm, it can be desirable to inflate both "east" and "west" bellows 210 (FIG. 2) without causing a change in angle of the solar panel in order to increase the rigidity or tension in the system to handle the increased turbulence from the storm. Similarly, it can be desirable to reduce the overall pressure in both "east" and "west" bellows 210 (FIG. 2) at the same time.

In some embodiments, the source of pressurized fluid 325 can be pressurized air from an air tank 320. Air from an air compressor or similar source is input to the air tank 320 through an air supply line 327. A check valve 330 can be used on the air supply line 327 to prevent the backflow of air and loss of pressure in the air tank 320. A pressure regulator 315 can be added between air tank 320 and the input of pressurized fluid 325 to maintain a consistent air pressure for the row controller 300.

It should be noted that components such as the air tank 320, pressure regulator 315, and check valve 330 are presented as examples only, and any appropriate technology may be used to create a source of pressurized fluid. With this in mind, and for the purpose of clarity, these components (or their appropriate replacements) are not shown the remaining FIGS. 5-16.

Figure 5:
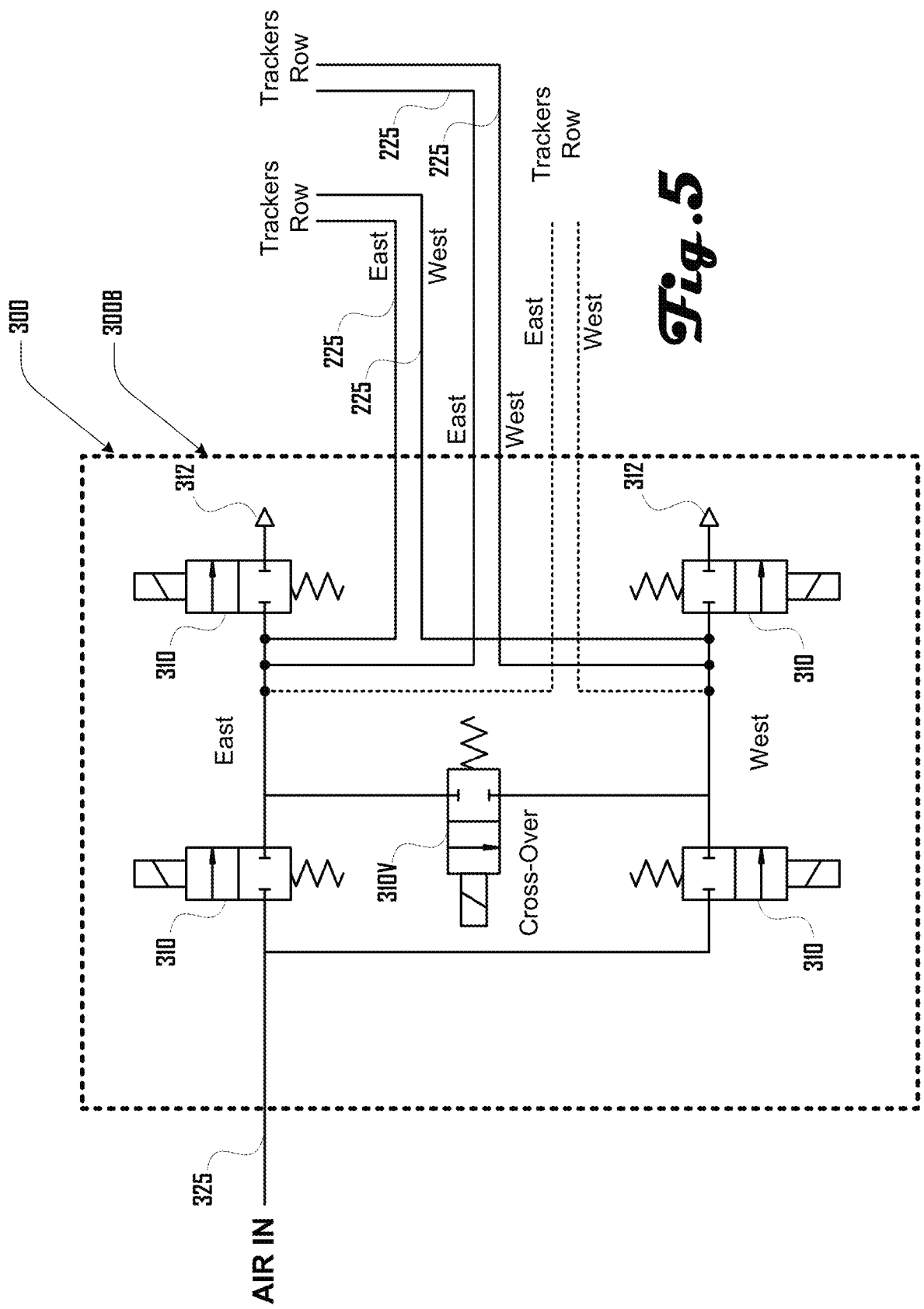

FIG. 5 illustrates an alternate embodiment of a row controller 300B, in which a fifth solenoid valve 310V is added to the example configuration of FIG. 4. This fifth valve 310V is a "cross-over" valve which connects the "east" and "west" valve circuits. Opening the cross-over valve 310V can allow the pressures in the "east" and "west" circuits to equalize, which can cause some or all of the solar panels connected to the fluidic actuators 420 (FIG. 2) to move to a "flat" or "zero" position as the air pressure in each side is made equal. This example configuration can be desirable because it can eliminate and/or greatly reduce the amount of supply air 325 needed to move the solar tracker rows to a flat position. For example, in some embodiments, over a 24-hour cycle of tracking the position of the sun, the total air used to position the solar panels can be reduced by up to 50% using this example configuration.

FIG. 6 illustrates an alternate embodiment of the row controller 300 of FIG. 5. In this alternate embodiment 300C, the cross-over valve 310V can be a "normally-open" two-way valve, three-way valve, or the like. A "normally-open" solenoid valve is a valve which defaults to an open position (such that fluid is allowed to pass through the valve) upon the removal of power. During a normal operation of row controller 300C, cross-over valve 310V can be energized such that it closes, stopping fluid flow through the valve to allow independent operation of the "east" and "west" valve circuits. However, in the event of the removal of power, cross-over valve 310V can default to its "normally open" configuration, allowing the pressure in the "east" and "west" valve circuits to equalize, which in turn allows the solar panels to return to a "zero" position. This configuration of row controller 300C can enable a fail-safe mode where some or all controlled tracker rows 120 (FIG. 1) can move to a flat position if the power being supplied to energize valve 310V is lost. This configuration can be called "stow on power loss."

Figure 7:
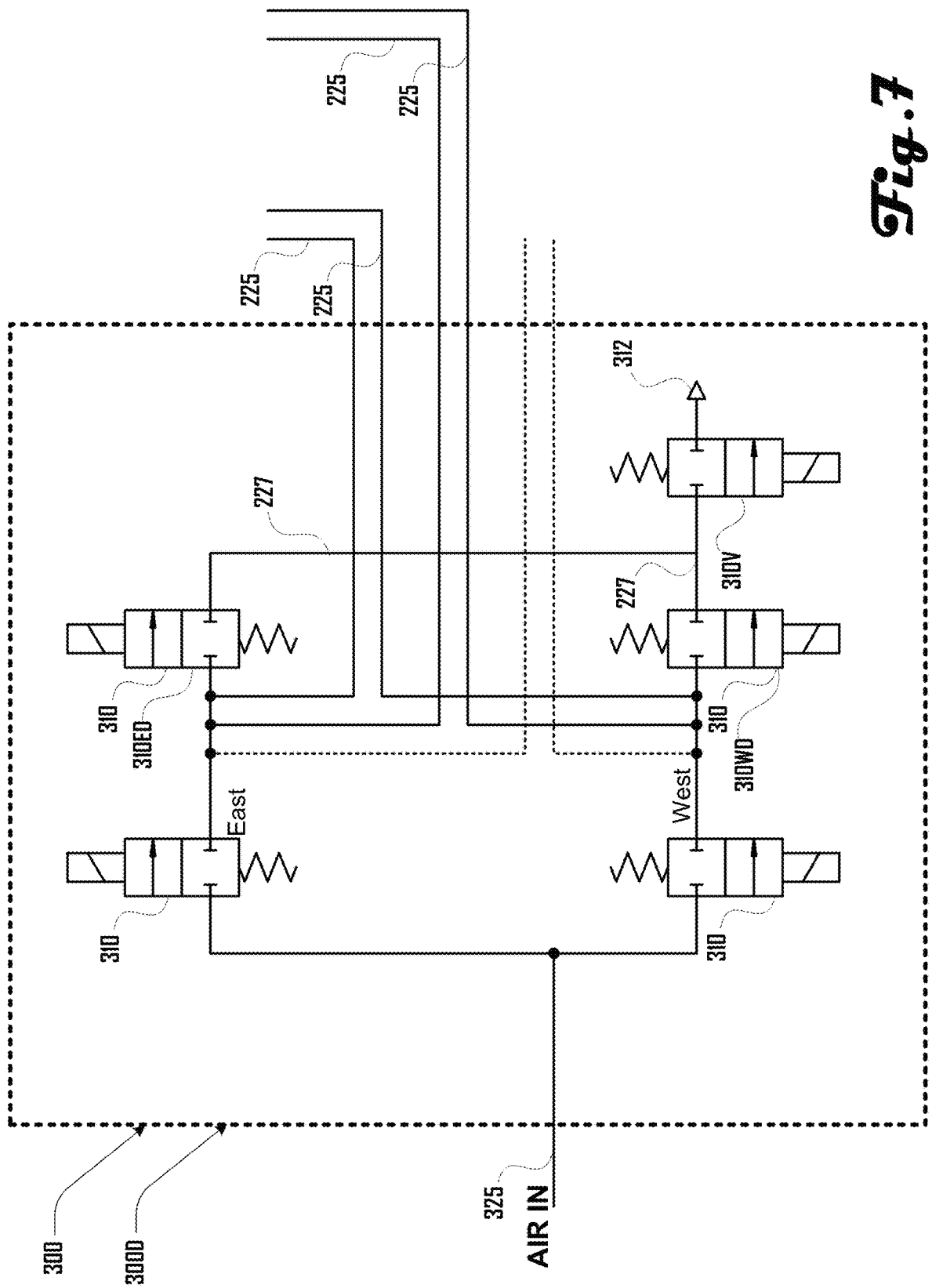

FIG. 7 illustrates an alternate embodiment of the row controller 300 of FIG. 5. In this alternate embodiment 300D, the cross-over solenoid valve 310V is moved to a position where it controls access to a shared vent 312. In this example, exhaust lines 227 from the "east dump" solenoid valve 310ED and the "west dump" solenoid valve 310WD are tied into cross-over valve 310V. Each of the "east" and "west" valve circuits can still exhaust air independently (for example, opening valves 310ED and 310V will vent air from the "east" valve circuit), but solenoid valve 310V can also be used as to exhaust air from both valve circuits simultaneously, allowing the pressure in both the "east" and "west" valve circuits to quickly equalize. An advantage of such a configuration is ease of manufacturing.

FIG. 8 illustrates another alternate embodiment of the row controller 300 of FIG. 5. In various embodiments, this example row controller 300E can maintain air pressure on power loss, even with small air leaks in the trackers or tubing. In this example, two input paths are provided from the source of pressurized air 325, allowing for a "failsafe" mode. During normal operation, solenoid valve 310F can be held closed, and solenoid valves 310EF and 310WF can be used to supply new air from a "normal" pressure regulator 315 to the "east" and "west" valve circuits, as appropriate. Upon power loss, solenoid valve 310V can enable the cross-over function, equalizing the pressure in the "east" and "west" valve circuits, and valve 310F will open, connecting a relatively lower-pressure, failsafe pressure regulator 315 to the system. This added air source from failsafe pressure regulator 315 can maintain the air in the valve circuits for an extended amount of time even if small leaks are present. Air can be maintained until the example high-pressure 80-gallon tank 320 is exhausted.

Figure 9:
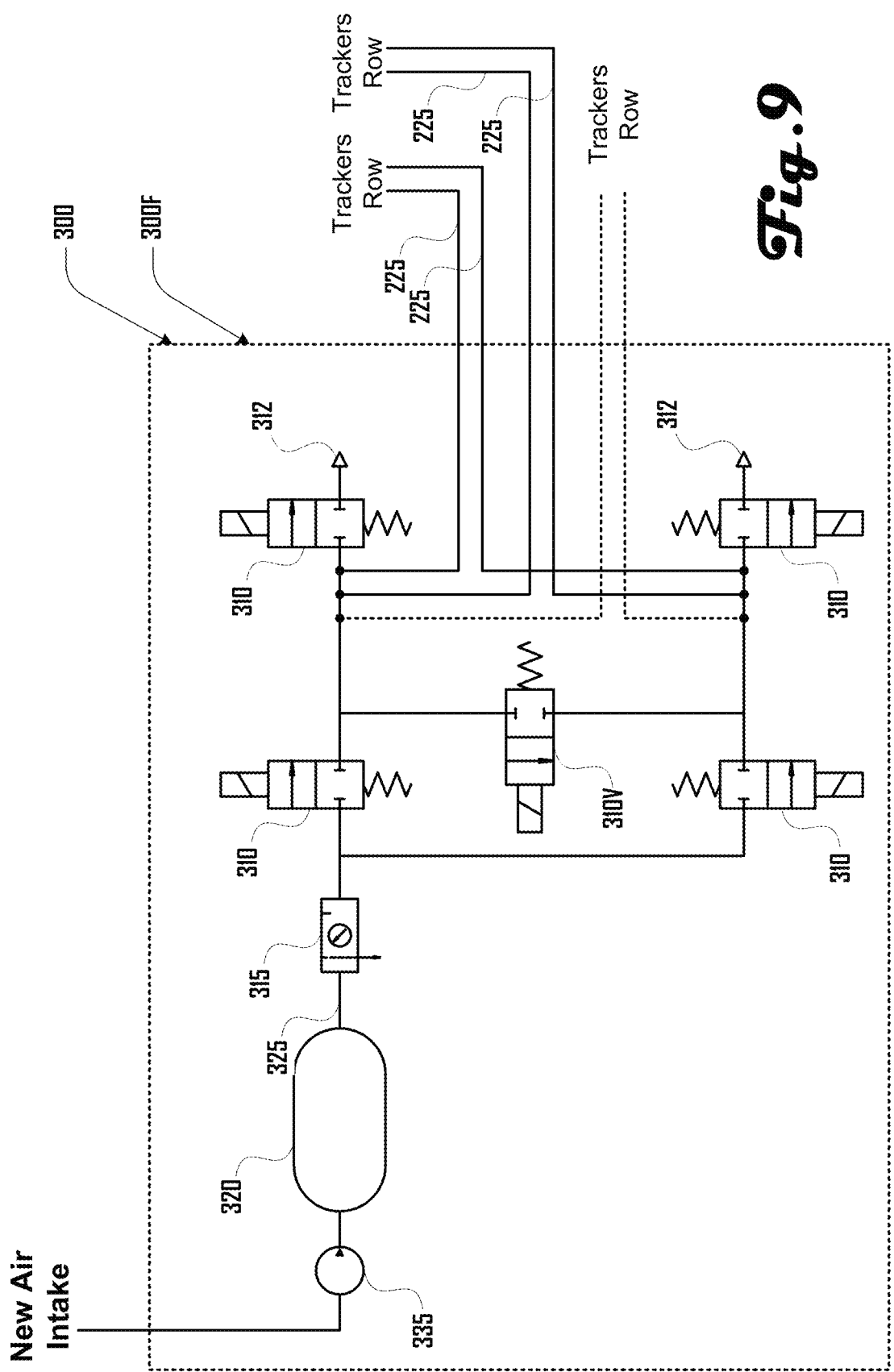

FIG. 9 illustrates that any of the example embodiments of row controllers 300 described herein can include an air compressor 335, optional air tank 320, and optional regulator 315 to supply pressurized air to the valve circuits. The compressor 335 takes in air and compresses it to a higher pressure which can be stored in air tank 320 or supplied directly to the pressure regulator 315.

Figure 10:
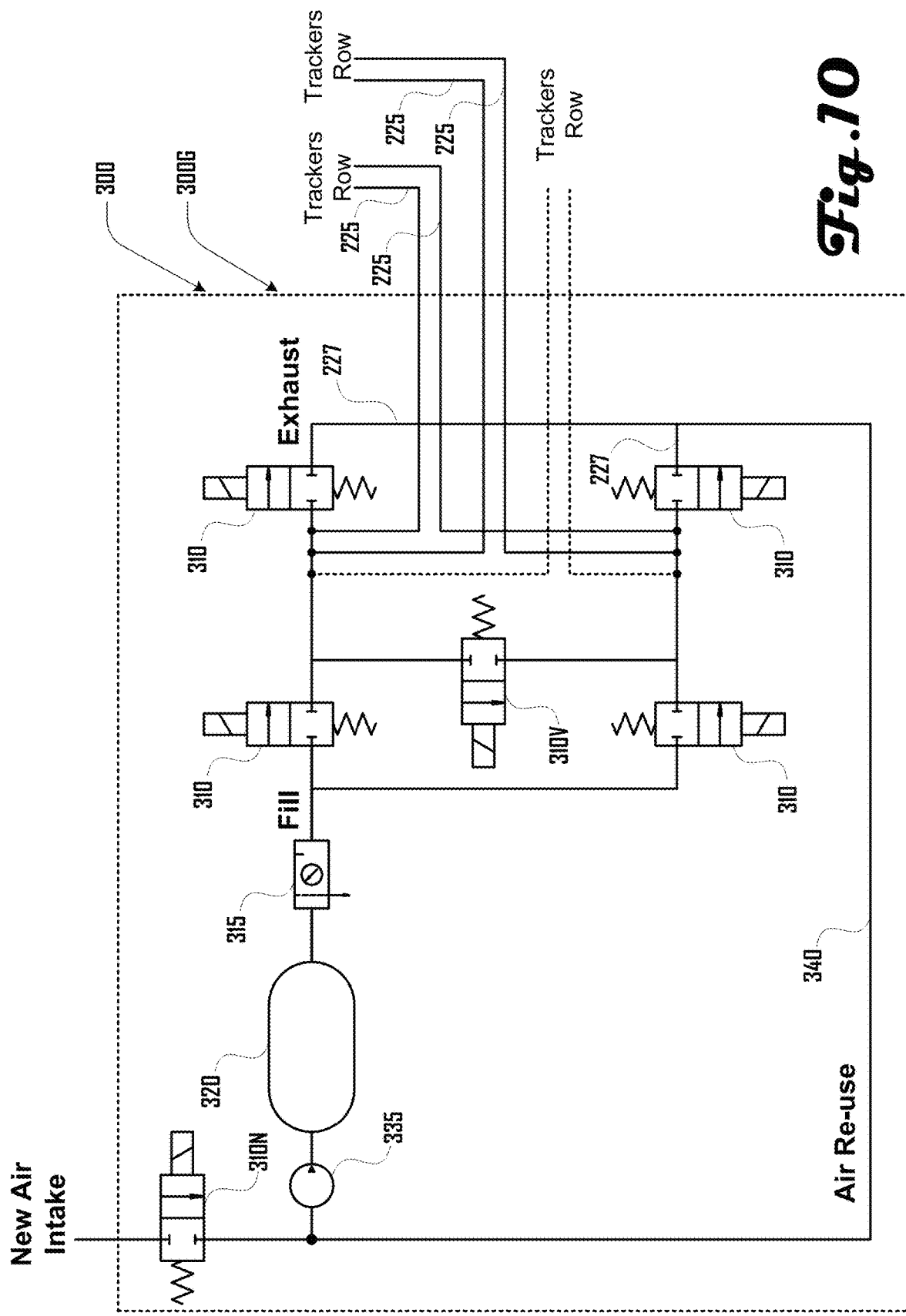

By including a compressor 335 in the row controller 300, pressurized air that is vented from the valve circuits can be routed back into the compressor as an input, recycling air to increase overall efficiency. For example, FIG. 10 illustrates one such embodiment of a row controller 300G. This row controller embodiment 300G comprises a re-use pathway 340, which is supplied from the exhaust lines 227 of the "east" and "west" valve circuits. The compressor 335 can re-use the exhausted air, or it can add new air to replenish any leaks in the system. In some embodiments, air re-use can reduce power of the compressor 335, increase motion speed, reduce costs to filter and dry new air, as well as other benefits.

Figure 11:
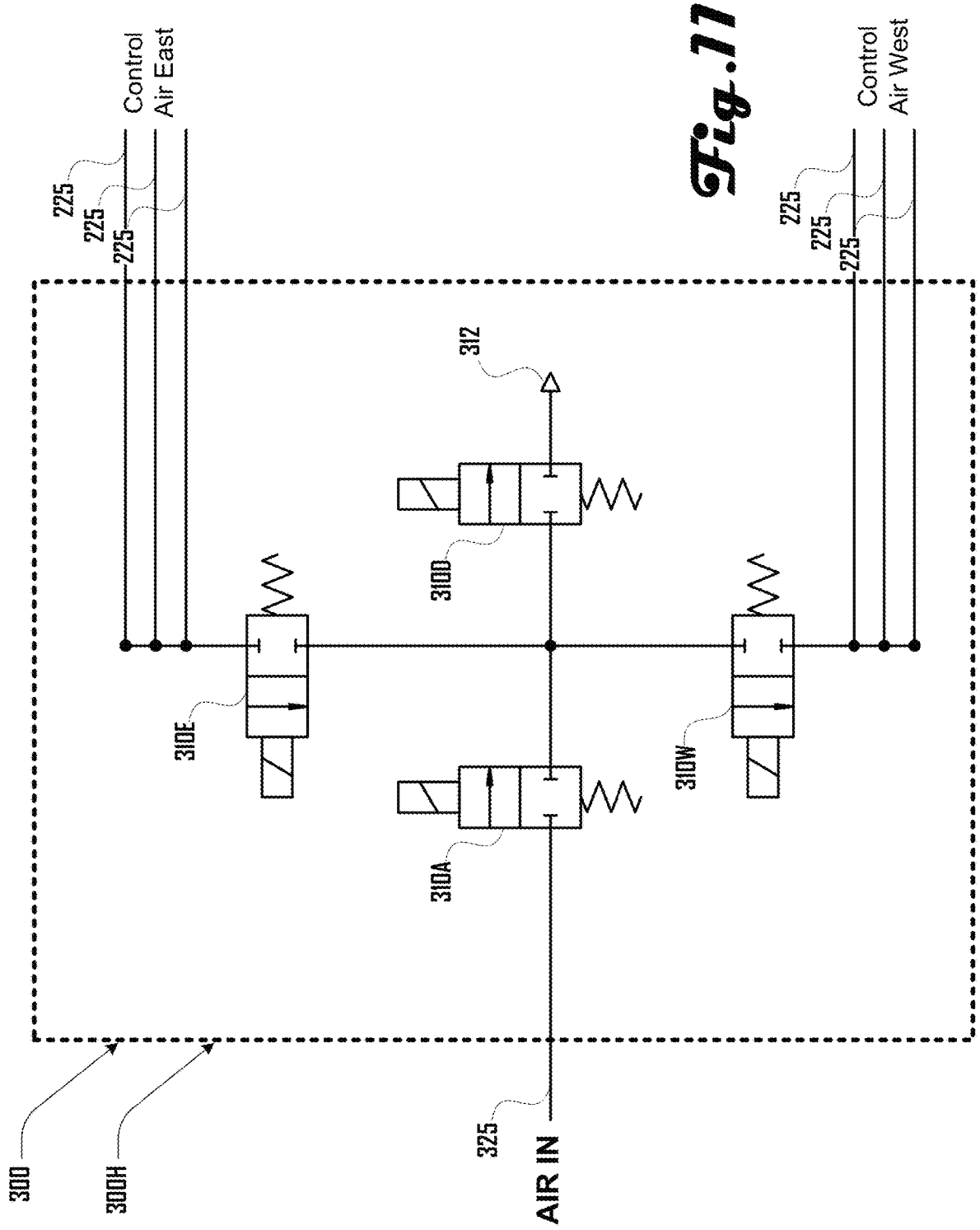

FIGS. 11-15 illustrate row controller embodiments based on a reduced number of solenoid valves compared to the embodiments of FIGS. 4-10. For example, FIG. 11 illustrates one example embodiment of a row controller 300H which includes some or all of the capabilities of the circuit of FIG. 5, but does so using one less valve 310. This example includes the capabilities of: fill east, dump east, fill west, dump west, and cross-over. In this example embodiment 300H, a single solenoid valve 310A controls the intake of pressurized air 325 for both the "east" and "west" valve circuits, and a single solenoid valve 310D controls the release or venting of pressurized air from both valve circuits. Solenoid valve 310E allows pressurized air to flow into the "east" control lines 225, and solenoid valve 310W allows pressurized air to flow into the "west" control lines 225. The "cross-over" function can be achieved by opening each of the valves 310E, 310W, and 310D at the same time, allowing both the "east" and "west" valve circuits to dump pressure through the 310D valve and equalizing the pressure in both circuits. While an advantage of configuration 300H is the use of fewer solenoid valves 310, it may not be possible to simultaneously fill one valve circuit while dumping the other valve circuit. For example, it may not be possible to simultaneously fill east and dump west, as air entering the valve circuits through valve 310A can escape through valve 310D instead of entering into the "east" valve circuit.

Figure 12:
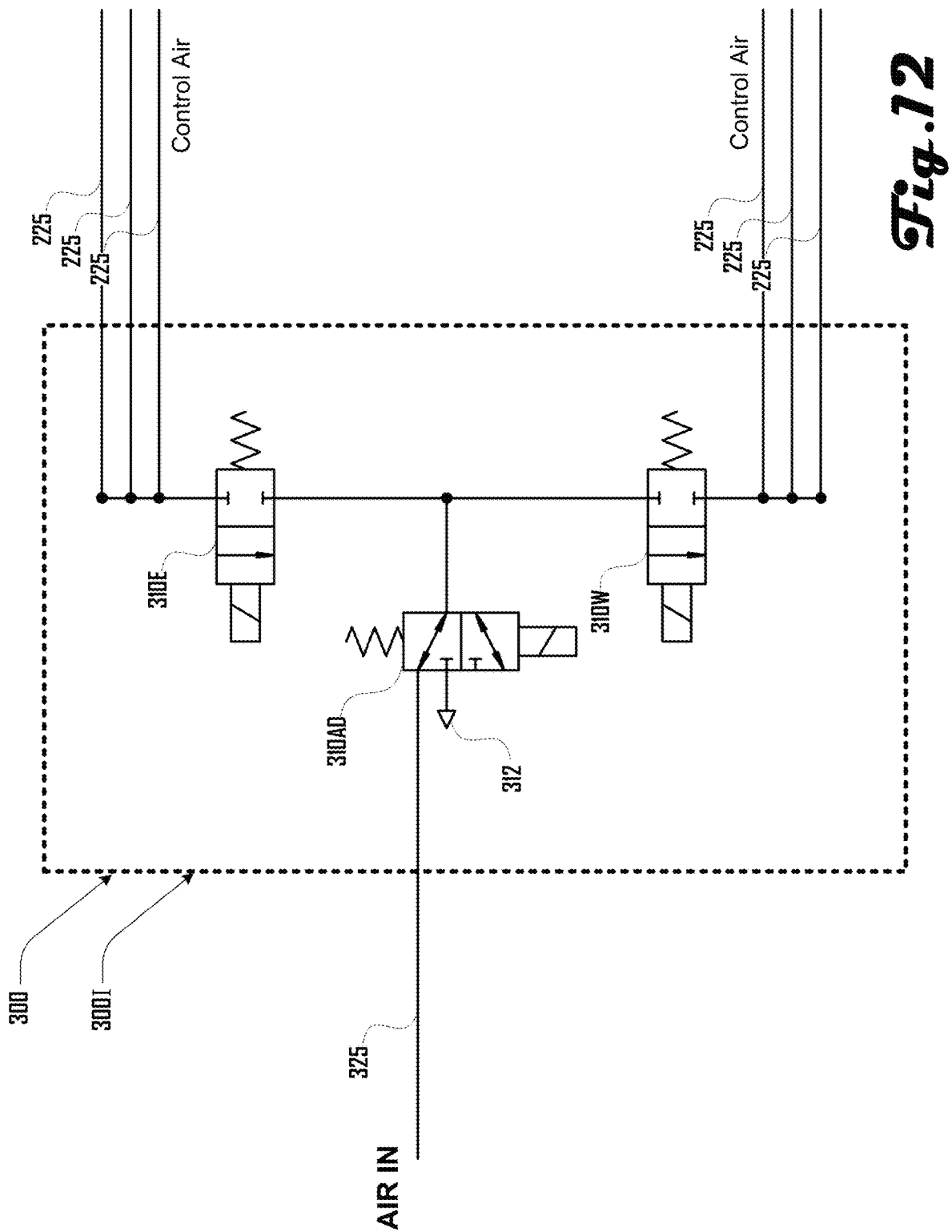

FIG. 12 illustrates another example embodiment of a row controller 300I using an even smaller number of solenoid valves 310. Row controller 300I offers the same capabilities of row controller embodiment 300H of FIG. 11, but does so by combining the functions of solenoid valves 310A and 310D from FIG. 11 into a single solenoid valve 310AD which accomplishes both functions (fill and dump). Solenoid valve 310AD can be a three-position valve which can be off (blocking the flow of air in both directions), open for filling, or open for venting. For example, if valve 310AD is set such that air may pass from the valve circuits out through vent 312, air from the "east" valve circuit, "west" valve circuit, or both may be exhausted.

Figure 13:
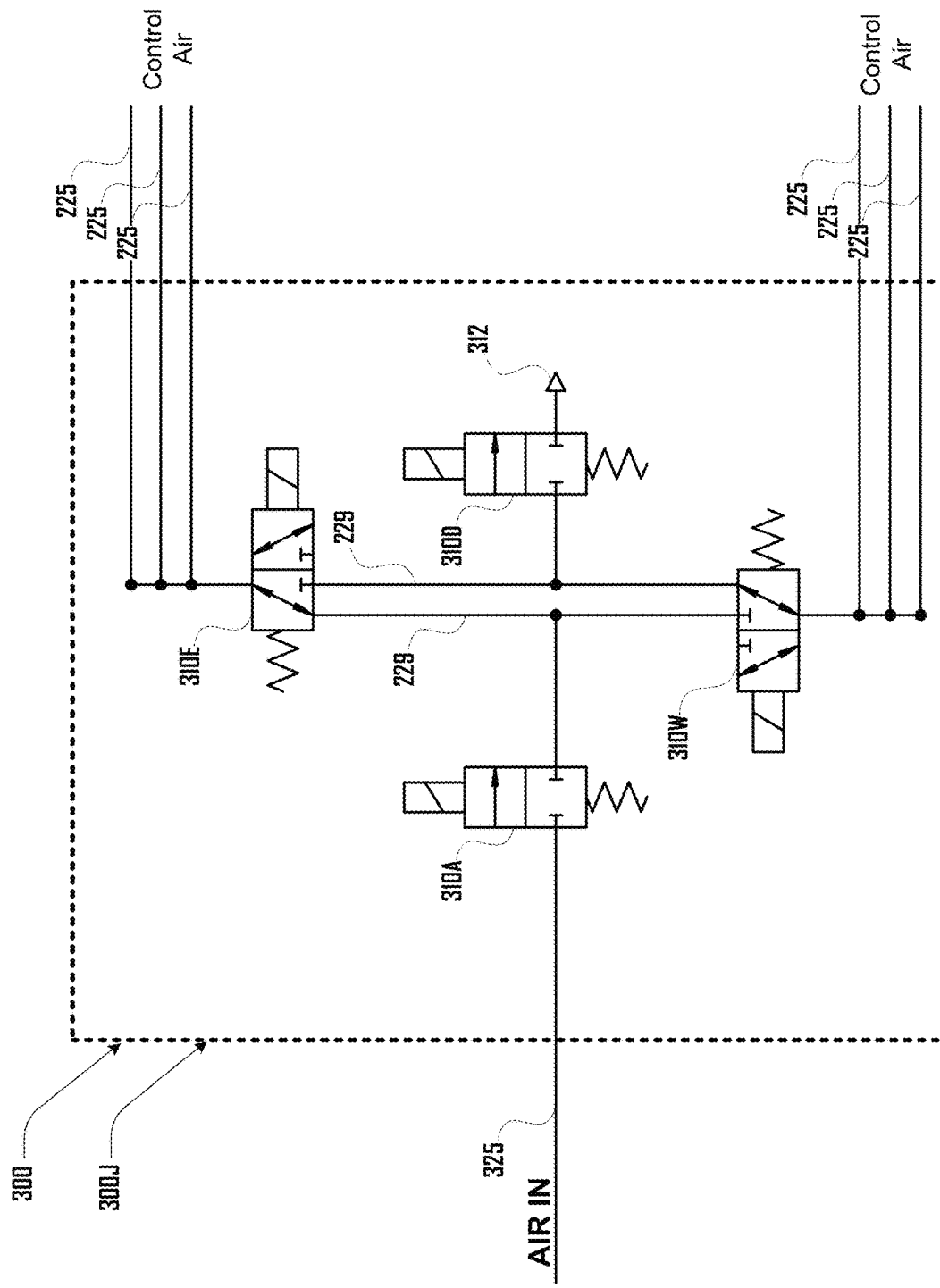

FIG. 13 illustrates an alternate example embodiment of a row controller 300J, which can have similar capabilities to the row controller 300H of FIG. 11. Configuration 300J includes the capabilities of: fill east, dump east, fill west, dump west, and cross-over. However, by cross-connecting the "east" and "west" valve circuits using supply lines 229, row controller 300J allows for the simultaneous filling of one valve circuit and venting of the other circuit.

Figure 14:
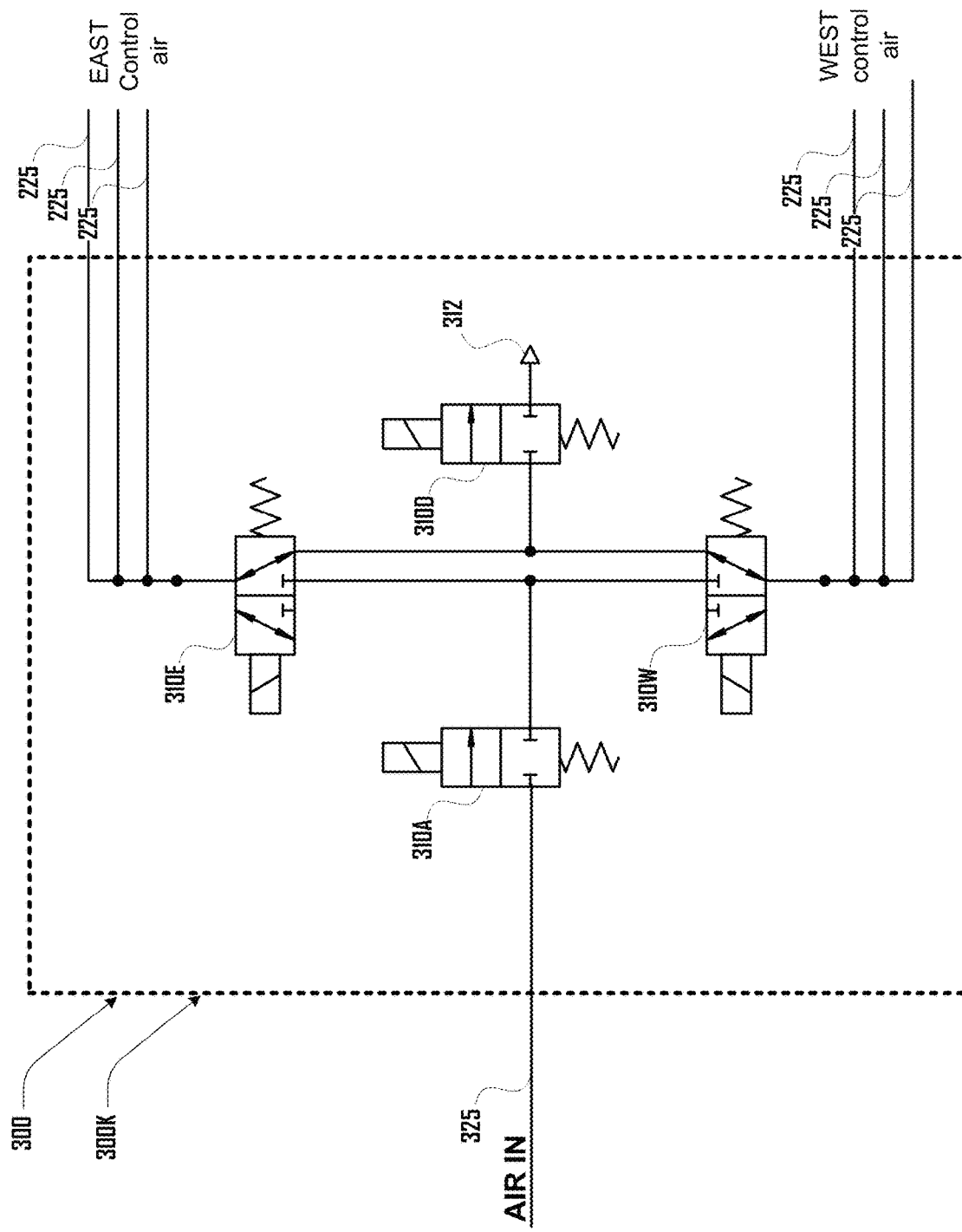

FIG. 14 illustrates one example embodiment of a row controller 300K. Row controller 300K can have some or all capabilities of embodiment 300J of FIG. 13, but is connected so as to add a "stow on power loss" function.

FIG. 15 illustrates another example embodiment of a row controller 300L which can have some or all capabilities of the embodiment of row controller 300K of FIG. 14, while adding in a "failsafe" capability for maintaining valve circuit air pressure on power loss. In various embodiments, row controller 300L can maintain air pressure on power loss, even with small air leaks in the trackers or tubing. In this example, two input paths are provided from the source of pressurized air 325, allowing for a "failsafe" mode. During normal operation, solenoid valve 310F can be held closed, and valve 310A can be used to supply new air to the bellows 210 (FIG. 2) through the solenoid valves 310E or 310W. Upon power loss, solenoid valves 310E or 310W can enable the cross-over function, and valve 310F can open, connecting a relatively lower-pressure, failsafe pressure regulator 315 to the system. This added pressure from failsafe pressure regulator 315 can maintain the air in the trackers for an extended amount of time even if small leaks are present. Air can be maintained until the example high-pressure 80-gallon tank 320 is exhausted.

FIG. 16 illustrates an embodiment of a row controller 300M which uses a compressor 335 to move air to fill either the "east" valve circuit or the "west" valve circuit, or to release air from either the "east" valve circuit or the "west" valve circuit, depending on the state of solenoid valve 310X. Solenoid valve 310A is used to allow air from the source of input air 325 to pass into the input of compressor 335. In some embodiments, compressor 335 is a one-direction pump which only supplies air to solenoid valve 310X. In other embodiments, compressor 335 is a two-direction pump which can also aid in the removal of air from the valve circuits through solenoid valve 310X. In the latter embodiments, solenoid valve 310A can be configured to direct air from the two-direction compressor 335 to solenoid valve 310D, where the air can be exhausted through vent 312.

Figure 17:
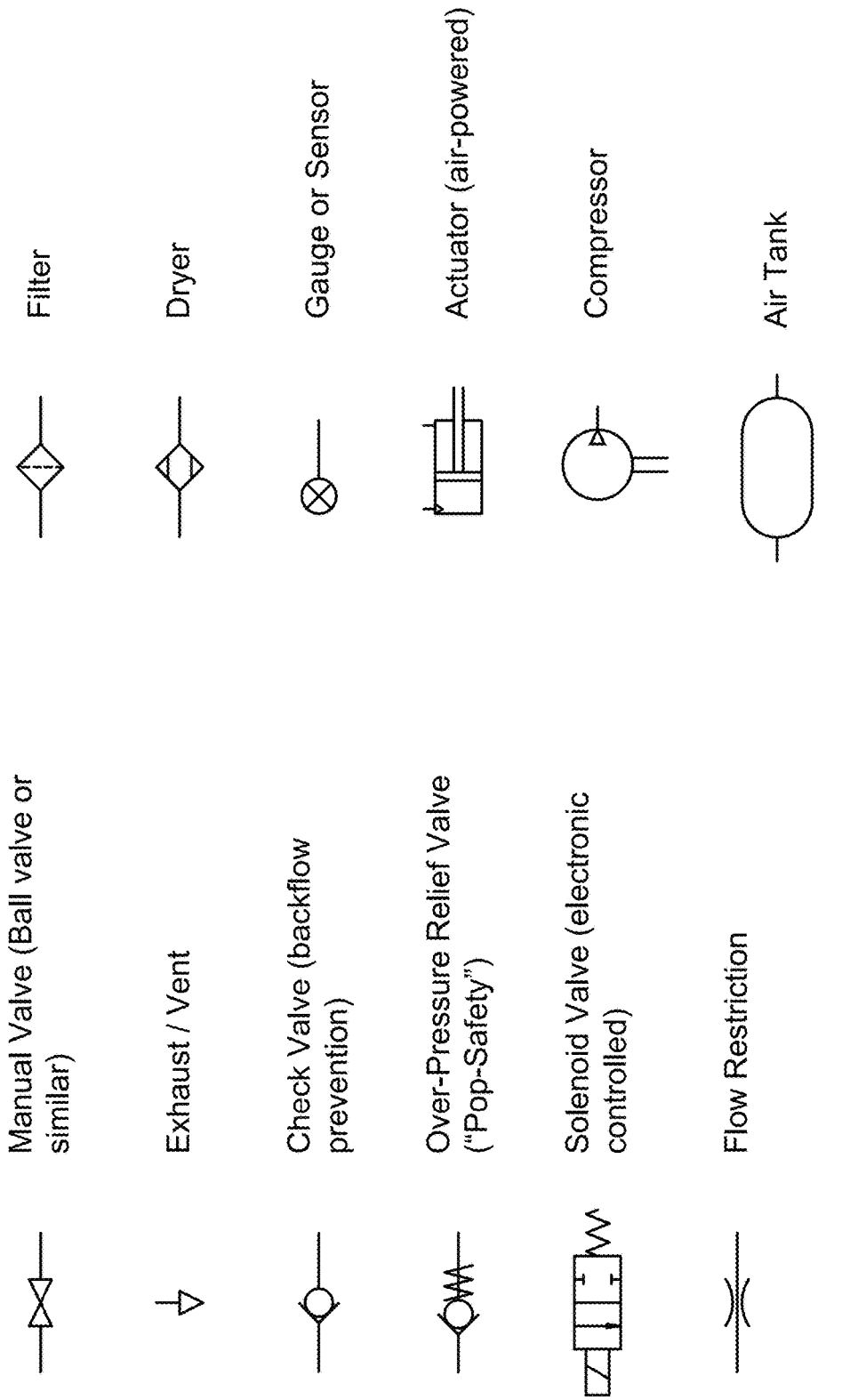
FIG. 17 illustrates pneumatic symbols as used in the present drawings and is provided for reference.

FIG. 17 illustrates pneumatic symbols as used in the present drawings and is provided for reference. It should be noted that while specific examples of valves and other elements are provided herein, these examples should not be construed to be limiting on the wide variety of alternative embodiments that are within the scope and spirit of the present disclosure. For example, while specific examples of valves are used to illustrate some example embodiments, further embodiments can use any suitable type of valve, pump, or compressor.

Figure 18:
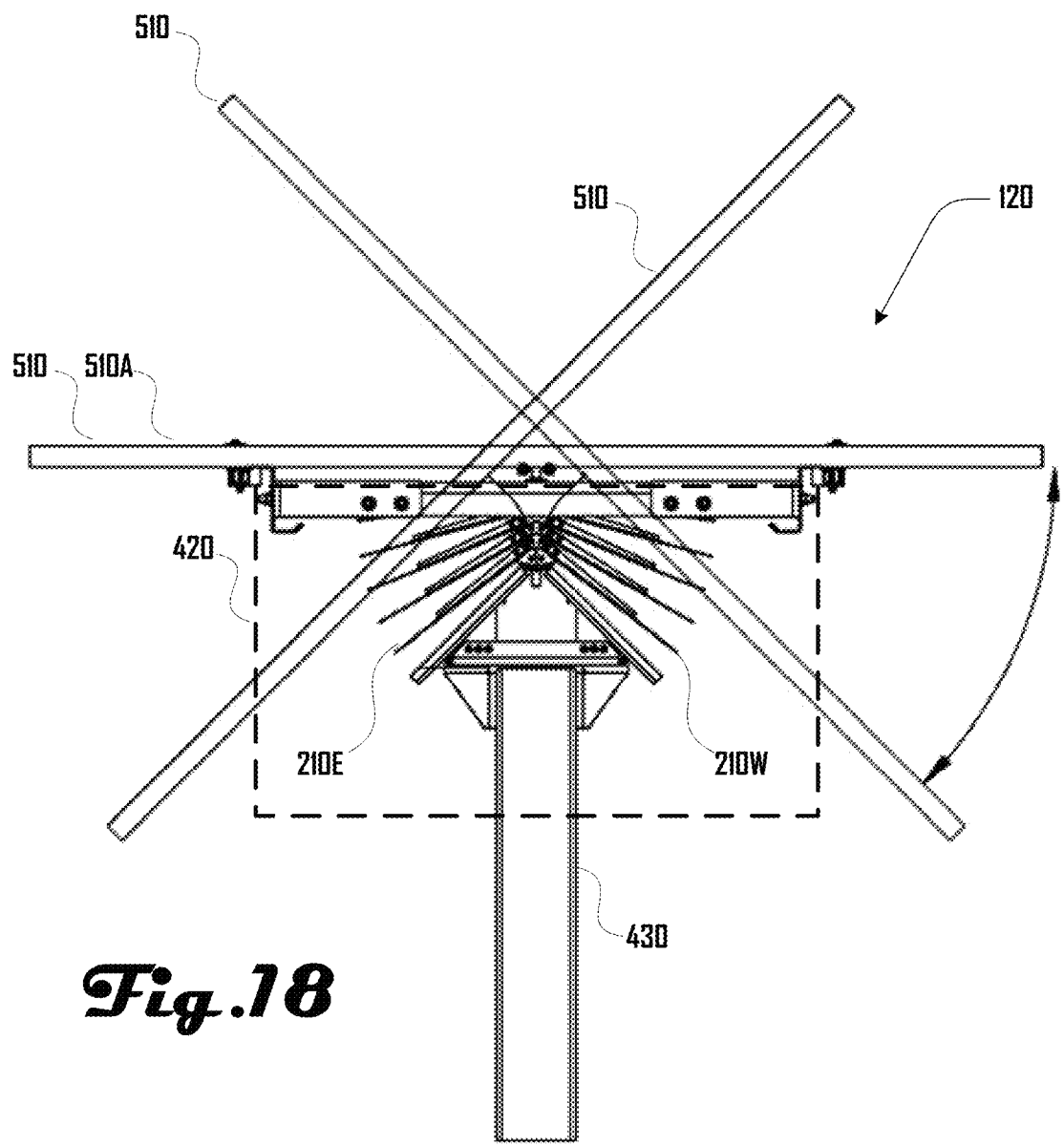
FIG. 18 illustrates a side view of a bellows actuator system mounted on a solar tracker row.

FIG. 18 illustrates a side view of a fluidic actuator 420 mounted on a solar tracker row 120 as described herein, including an "east" bellows 210E and a "west" bellows 210W, configured to move a solar (photovoltaic) panel 510 disposed on the top of the fluidic actuator 420. It should be noted that the solar panel 510 is shown in three different positions in FIG. 18, showing possible positions of the solar panel 510 based on the state of the fluidic actuator 420. The solar panel labeled as 510A is intended to illustrate a flat or "zero" position of the solar panel 500, when both bellows 210E and 210W have equal pressures. It should also be noted that the "zero" position of a solar panel 500 may not in fact be horizontal with respect to the surface of the Earth, but may instead be any appropriate position created by equal pressure in both bellows 210E and 210W.

FIG. 19a illustrates a solar tracker row 120 as shown in FIG. 2. FIG. 19b illustrates an underside perspective view of the same or similar solar tracker row 120 including four fluidic actuators 420 mounted beneath one or more solar panels 510.

FIG. 20a illustrates how solar panels 510 can be disposed on rails 520 of a solar tracker row 120. FIG. 20b illustrates solar panels 510 disposed on rails 520 of a solar tracker row 120, with one panel 510 removed to show a fluidic actuator 420.

Figure 21A:
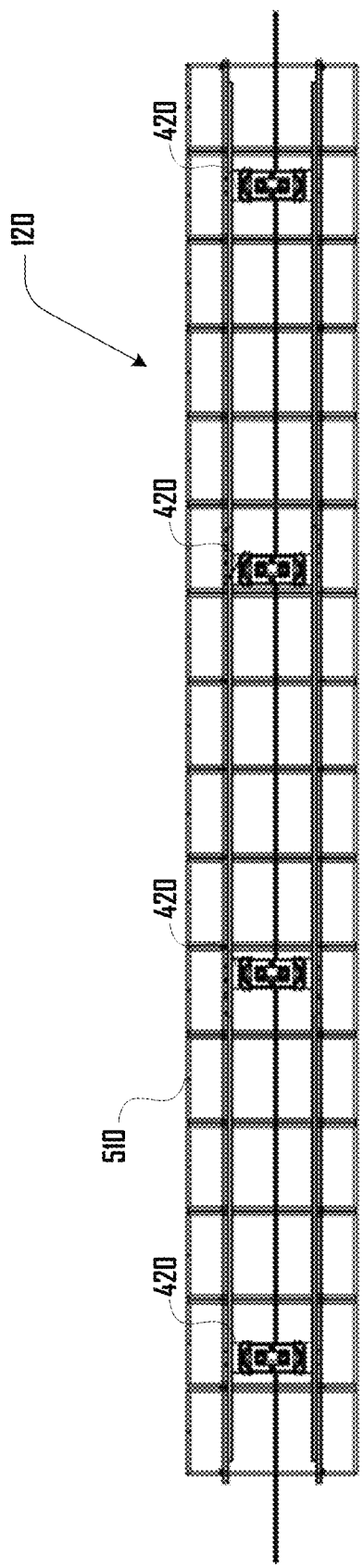
FIG. 21a illustrates a bottom view of a solar tracker row having four pairs of bellows actuators and a plurality of solar panels.
Figure 21B:
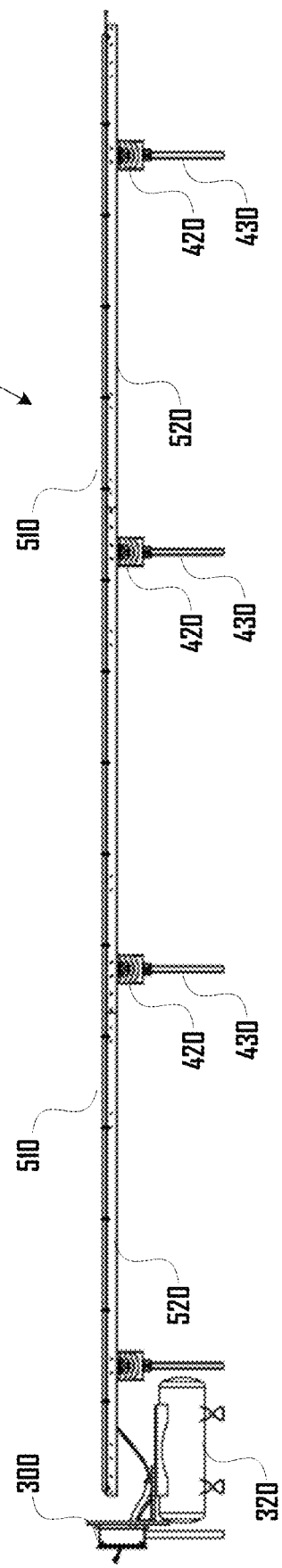
FIG. 21b illustrates a side view of the solar tracker row and related equipment.

FIG. 21a illustrates a bottom view of a solar tracker row 120 having four fluidic actuators 420 and a plurality of solar panels 510 in accordance with an embodiment. FIG. 21b illustrates a side view of the solar tracker row 120, including a row controller 300 having a fluid supply tank 320, configured to introduce and/or remove fluid from the fluidic actuators 420 to move the solar panels 510.

FIG. 22 is a close-up, side view of a solar tracker row 120, including a row controller 300, air tank 320, support post 430, fluidic actuator 420, rails 520, and solar panel 510.

Figure 23:
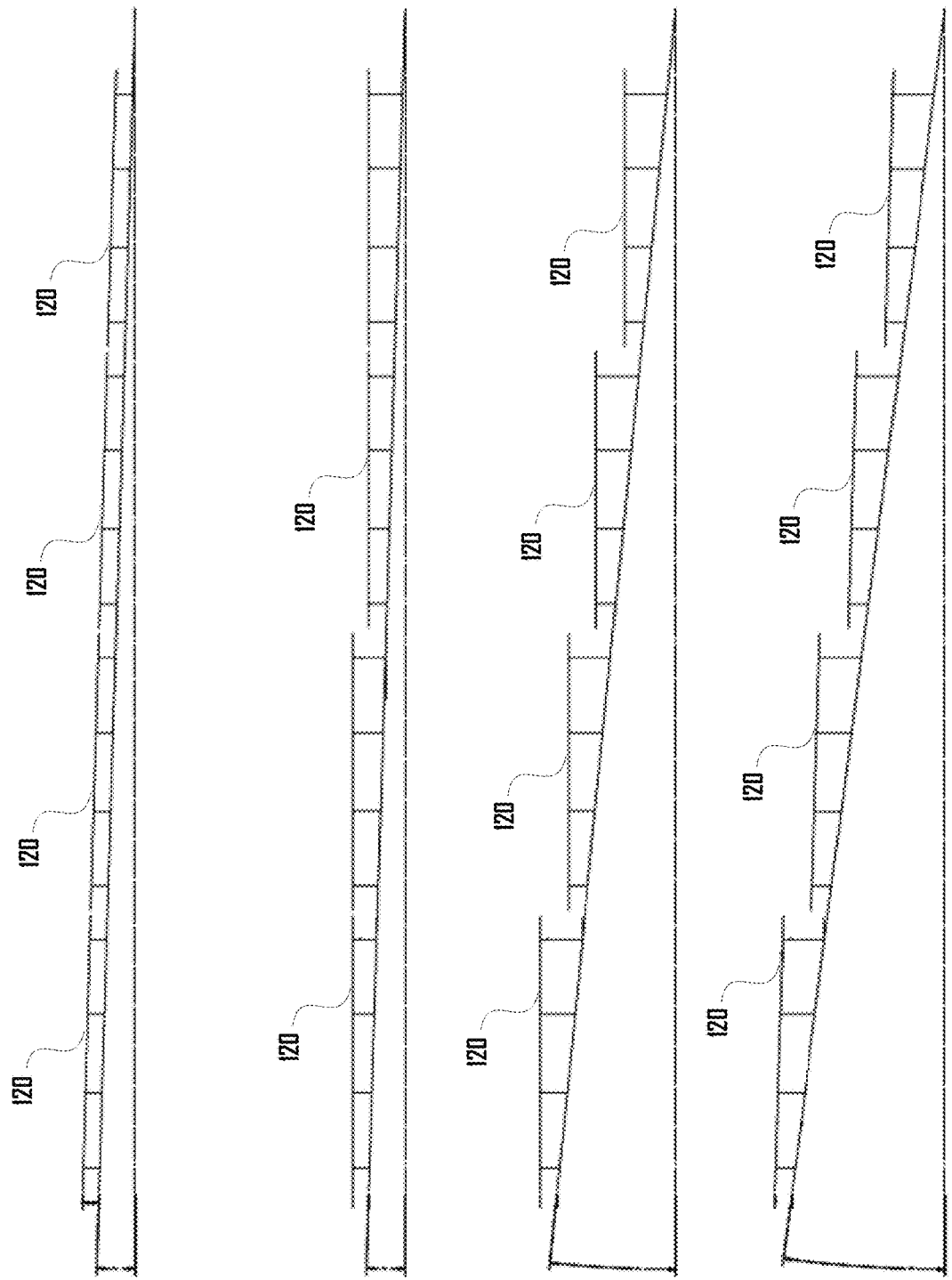
FIG. 23 illustrates several solar tracker rows as they can be disposed on slopes of various grades.

FIG. 23 illustrates several solar tracker rows 120 as they can be disposed on slopes of various grades.

Figure 24:
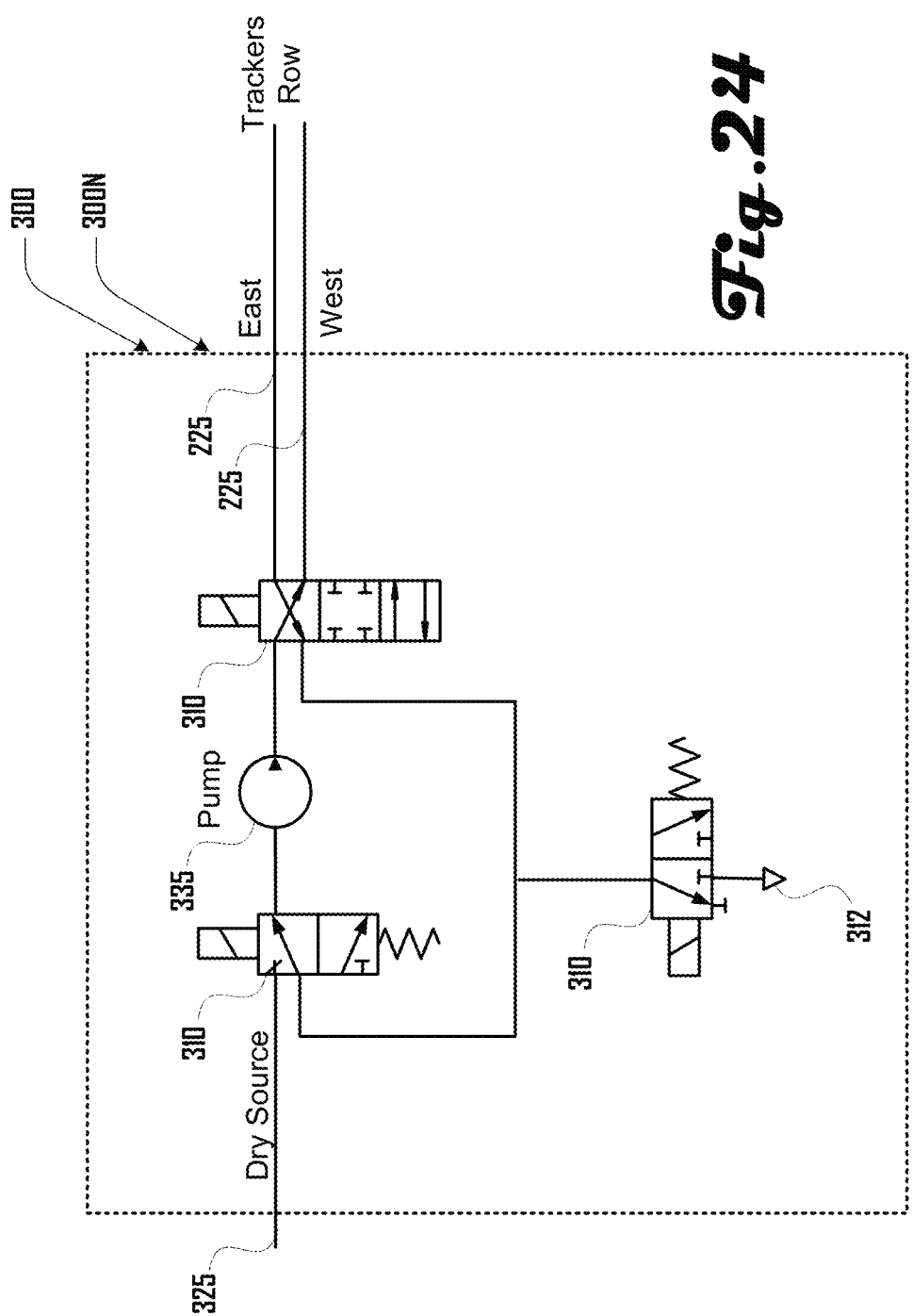
FIG. 24 illustrates another example embodiment of a row controller providing various features and configurations of solenoid valves.

FIG. 24 illustrates another example embodiment of a row controller providing various features and configurations of valves.

The described embodiments are susceptible to various modifications and alternative forms, and specific examples thereof have been shown by way of example in the drawings and are herein described in detail. It should be understood, however, that the described embodiments are not to be limited to the particular forms or methods disclosed, but to the contrary, the present disclosure is to cover all modifications, equivalents, and alternatives.

What is claimed is:

1. A method of controlling a rotation of a solar panel about an axis of rotation based at least in part on a position of the sun, the method comprising:
   based at least in part on an indication of the position of the sun, introducing or removing fluid from a plurality of fluidic actuators of a fluidic actuation system to generate rotation of the solar panel about the axis of rotation, the fluidic actuation system comprising:
      a first bellows coupled to the solar panel, such that inflation of the first bellows causes the solar panel to rotate about the axis of rotation in a first direction, and deflation of the first bellows causes the solar panel to rotate about the axis of rotation in a second direction;
      a second bellows coupled to the solar panel, such that inflation of the second bellows causes the solar panel to rotate about the axis of rotation in the second direction, and deflation of the second bellows causes the solar panel to rotate about the axis of rotation in the first direction;
      a source of pressurized fluid;
      a first valve circuit, comprising:
         a first solenoid valve; and
         a second solenoid valve;
      a second valve circuit, comprising:
         a third solenoid valve; and
         a fourth solenoid valve; and
      a controller;
   wherein the first valve circuit is operatively connected between the source of pressurized fluid and the first bellows, and the second valve circuit is operatively connected between the source of pressurized fluid and the second bellows, and
   wherein the controller operates the first solenoid valve to supply pressurized fluid from the source of pressurized fluid to the first bellows, the controller operates the second solenoid valve to release the pressurized fluid from the first bellows, the controller operates the third solenoid valve to supply pressurized fluid from the source of pressurized fluid to the second bellows, and the controller operates the fourth solenoid valve to release the pressurized fluid from the second bellows.

2. The method of claim 1, wherein the first valve circuit is completely independent of the second valve circuit.

3. The method of claim 1, wherein the first valve circuit and second valve circuit are connected by one or more fluid pathways each controlled by a fifth and sixth solenoid valve.

4. The method of claim 3, further comprising opening the fifth and sixth solenoid valves connecting the first valve circuit and second valve circuit to cause an equalization of pressure between the first and second valve circuits and between the first and second bellows.

5. The method of claim 4, wherein equalizing the pressure between the first and second valve circuits causes the solar panel to return to a resting position, as the pressure in the opposing first and second bellows equalizes.

6. The method of claim 1, wherein the controller comprises an electronic control unit computing device.

7. A system for controlling a rotation of one or more panels about an axis of rotation, comprising:
   one or more panels defining a longitudinal axis;
   one or more fluidic actuators coupled to the one or more panels and defining an axis of rotation that is parallel to the longitudinal axis of the one or more panels, the one or more fluidic actuators comprising:
      a first bellows, and
      a second bellows,
   a fluid source;
   a first valve circuit fluidically coupled to the first bellows and the fluid source, the first valve circuit comprising:
      a first valve; and
      a second valve;
   a second valve circuit fluidically coupled to the second bellows and the fluid source, the first valve circuit comprising:
      a third valve; and
      a fourth valve; and
   a controller;
   wherein the controller operates the first valve to control a supply of fluid from the fluid source to the first bellows based at least in part on a position of the sun, and wherein the controller operates the second valve to release fluid from the first bellows,
   wherein the controller operates the third valve to control a supply of the fluid from the fluid source to the second bellows based at least in part on a position of the sun, and wherein the controller operates the fourth valve to release fluid from the second bellows,
   wherein introduction or release of fluid from one or both of the first and second bellows is configured to cause rotation of the one or more actuators about the axis of rotation.

8. The system of claim 7, wherein the first valve circuit is completely independent of the second valve circuit.

9. The system of claim 7, wherein the first valve circuit and second valve circuit are connected by one or more fluid pathways controlled by a fifth valve.

10. The system of claim 9, further comprising opening the fifth valve connecting the first valve circuit and second valve circuit to cause an equalization of pressure between the first and second valve circuits and between the first and second bellows.

11. The system of claim 10, wherein equalizing the pressure between the first and second valve circuits causes the panel to return to a resting position, as the pressure in the opposing first and second bellows equalizes.

12. A system for controlling a rotation of and object about an axis of rotation, comprising:
    a fluidic actuator comprising:
        a first bellows, and
        a second bellows,
    a first valve circuit fluidically coupled to the first bellows and a fluid source, the first valve circuit comprising:
        a first valve; and
        a second valve; and
    a second valve circuit fluidically coupled to the second bellows and the fluid source, the second valve circuit comprising:
        a third valve; and
        a fourth valve;
    wherein the first valve is configured to control a supply of fluid from the fluid source to the first bellows, and wherein the second valve is configured to release fluid from the first bellows,
    wherein the third valve is configured to control a supply of the fluid from the fluid source to the second bellows, and wherein the fourth valve is configured to release the fluid from the second bellows, and
    wherein introduction or release of fluid from one or both the first and second bellows is configured to cause rotation about the axis of rotation.

13. The system of claim 12, wherein the first valve circuit is completely independent of the second valve circuit.

14. The system of claim 12, wherein the first valve circuit and second valve circuit are connected by one or more fluid pathways controlled by a fifth valve.

15. The system of claim 14, further comprising opening the fifth valve connecting the first valve circuit and second valve circuit to cause an equalization of pressure between the first and second valve circuits and between the first and second bellows.

16. The system of claim 15, wherein equalizing the pressure between the first and second valve circuits causes the object to return to a resting position, as the pressure in the opposing first and second bellows equalizes.

17. The system of claim 12, wherein the system includes a stow-on-power-loss system including a normally-open valve with a spring-return, where the normally-open valve is held closed when the system is powered, and the spring-return automatically opens the normally-open valve when the system loses power, the stow-on-power-loss system configured to automatically actuate the first and second bellows to a stow position when the system loses power.

18. The system of claim 12, wherein the system includes a replenish-leaks-on-power-loss system including a normally-open valve with a spring-return, where the normally-open valve is held closed when the system is powered, and the spring-return automatically opens the normally-open valve when the system loses power, the replenish-leaks-on-power-loss system configured to automatically introduce fluid to the system from a pressurized fluid source when the system loses power.

19. The system of claim 12, wherein the controller comprises an electronic control unit computing device.

* * * * *